(12) United States Patent
Song

(10) Patent No.: US 10,734,469 B2
(45) Date of Patent: Aug. 4, 2020

(54) DISPLAY DEVICE

(71) Applicant: Samsung Display Co., Ltd., Yongin-si (KR)

(72) Inventor: Jung Bae Song, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/506,117

(22) Filed: Jul. 9, 2019

(65) Prior Publication Data

US 2020/0020759 A1    Jan. 16, 2020

(30) Foreign Application Priority Data

Jul. 11, 2018  (KR) .................. 10-2018-0080326

(51) Int. Cl.
  *H01L 27/32*    (2006.01)
  *H01L 51/52*    (2006.01)
  *G06F 3/041*    (2006.01)
(52) U.S. Cl.
  CPC ......... *H01L 27/3276* (2013.01); *G06F 3/041* (2013.01); *H01L 27/323* (2013.01); *H01L 27/3272* (2013.01); *H01L 51/529* (2013.01)

(58) Field of Classification Search
  CPC ............. H01L 27/323; H01L 27/3272; H01L 27/3276; H01L 51/529; G06F 3/041
  See application file for complete search history.

(56) References Cited

U.S. PATENT DOCUMENTS

| 2010/0110328 A1* | 5/2010 | Tatebayashi | G02B 6/0091 349/58 |
| 2013/0044271 A1* | 2/2013 | Momose | G02F 1/133615 349/58 |
| 2014/0092630 A1* | 4/2014 | Franklin | G02B 6/0031 362/609 |

* cited by examiner

*Primary Examiner* — Peniel M Gumedzoe
(74) *Attorney, Agent, or Firm* — H.C. Park & Associates, PLC

(57) ABSTRACT

A display device including a display panel; a panel support disposed on a lower surface of the display panel; a first circuit board connected to the display panel and disposed such that it overlaps with a lower surface of the panel support; and an adhesive member disposed between the panel support and the first circuit board and including a concave-convex profile on a first surface facing the panel support. The first circuit board and the panel support are at least partially coupled with each other by the adhesive member.

20 Claims, 32 Drawing Sheets

DISPLAY DEVICE

CROSS REFERENCE TO RELATED APPLICATION

This application claims priority from and the benefit of Korean Patent Application No. 10-2018-0080326 filed on Jul. 11, 2018, which is hereby incorporated by reference for all purposes as if fully set forth herein.

BACKGROUND

Field

Exemplary embodiments of the invention relate generally to a display device.

Discussion of the Background

Organic light-emitting display ("OLED") devices have advantages over other types of display devices, such as high luminance, low driving voltage, fast response speed, and a wide range of color reproduction. Accordingly, OLED devices are currently being employed by a variety of devices, including smart phones. An OLED device includes a display panel including organic light-emitting elements. In an organic light-emitting element, a cathode electrode and an anode electrode are disposed around an organic emissive layer. When a voltage is applied to the two electrodes, a visible light is generated in the organic emissive layer connected to the electrodes.

A panel sheet unit including a variety of functional sheets is disposed under the display panel in order to protect the display panel from heat, external impact, etc.

The sheets of the panel sheet unit disposed under the display panel may not be stacked on one another sequentially but may be disposed with certain level differences in some regions under the display panel.

Such level differences may be visible from the outside, which causes deterioration of display quality.

The above information disclosed in this Background section is only for understanding of the background of the inventive concepts, and, therefore, it may contain information that does not constitute prior art.

SUMMARY

Exemplary embodiments of the present invention provide a display device that can hide level differences created between the features under the display panel.

Additional features of the inventive concepts will be set forth in the description which follows, and in part will be apparent from the description, or may be learned by practice of the inventive concepts.

An exemplary embodiment of the invention provides a display device including a display panel; a panel support disposed on a lower surface of the display panel; a first circuit board connected to the display panel and disposed such that it overlaps with a lower surface of the panel support; and an adhesive member disposed between the panel support and the first circuit board and including a concave-convex profile on a first surface facing the panel support. The first circuit board and the panel support are at least partially coupled with each other by the adhesive member.

A second surface of the adhesive member may be attached to the first circuit board, and the adhesive member may include a first region where the concave-convex profile on the first surface comes in contact with the panel support, and a second region where the concave-convex profile is spaced apart from the panel support.

A thickness of the adhesive member in the second region may be greater than a thickness of the adhesive member in the first region.

A width of the adhesive member in the second region may be less than a width of the adhesive member in the first region.

The panel support may include a first sheet and a second sheet disposed on a lower surface of the first sheet in the first region, wherein the first sheet may be disposed on the entire surface of the display panel, and wherein the second sheet may be attached to the first circuit board.

The panel support may be spaced apart from the first circuit board in the second region.

The panel support may further include a third region adjacent to the second region, wherein the panel support may include a third sheet disposed on the lower surface of the first sheet in the third region, and wherein the third sheet may be attached to the first circuit board.

A distance between the first circuit board and the third sheet in the third region may be less than a distance between the first circuit board and the first sheet in the second region.

The first sheet may be a shielding electrode layer.

The second sheet may be a heat dissipation functional layer.

The adhesive member may include a base, a first adhesive layer disposed between an upper surface of the base and the lower surface of the panel support and may include a first pattern of adhesive elements, and a second adhesive layer disposed between a lower surface of the base and the first circuit board. The adhesive elements of the first pattern may form convex portions of the adhesive member; and locations where the first pattern is not disposed may form concave portions of the adhesive member; and the upper surface of the base may be exposed at the concave portions of the adhesive member.

The second adhesive layer may include a second pattern of adhesive elements, and the second pattern may not overlap with the first pattern of the first adhesive layer in a thickness direction.

The adhesive member may include a base, a first adhesive layer disposed on an upper surface of the base and including a pattern of adhesive elements, and a second adhesive layer disposed between a lower surface of the base and the first circuit board. A part of the upper surface of the base may be exposed at the locations where the pattern is not disposed, and the adhesive member may further include a third adhesive layer covering an upper surface and side surface of the first adhesive layer and the exposed upper surface of the base and disposed between the first adhesive layer and the panel support. The third adhesive layer may include the concave-convex profile of the adhesive member, in which the convex portions of the third adhesive layer overlap with the pattern of the first adhesive layer in the thickness direction, and the concave portions of the third adhesive layer overlap with the locations where the pattern is not disposed.

The adhesive member may include a base, a first adhesive layer disposed on an upper surface of the base and including a first pattern of adhesive elements, a second adhesive layer disposed between a lower surface of the base and the first circuit board, and a third adhesive layer including a second pattern of adhesive elements. The second pattern of the third adhesive layer may be disposed on an upper surface of the first adhesive pattern to overlap it, and the third adhesive layer may be disposed between the first adhesive layer and the panel support. The convex portions of the adhesive member may overlap with locations where the first pattern and the second pattern overlap with one another in the thickness direction.

The adhesive member may include a base, a first adhesive layer disposed between the upper surface of the base and the panel support, and a second adhesive layer disposed between a lower surface of the base and the first circuit board. The first adhesive layer may include the concave-convex profile of the adhesive member.

The second adhesive layer may include a pattern of adhesive elements, and the pattern may not overlap with the convex portions of the first adhesive layer in the thickness direction.

The adhesive member further includes a third adhesive layer covering the first adhesive layer, disposed between the first adhesive layer and the panel support, and including the concave-convex profile of the adhesive member. The first adhesive layer may include a second concave-convex profile; the convex portions of the third adhesive layer may overlap with the second concave portions of the first adhesive layer in the thickness direction; and the concave portions of the third adhesive layer may overlap with the second concave portions of the first adhesive layer in the thickness direction.

The adhesive member may further include a third adhesive layer disposed on an upper surface of the first adhesive layer and disposed between the first adhesive layer and the panel support. The first adhesive layer may include a second concave-convex profile; the third adhesive layer may include a pattern of adhesive elements, and the convex portions of the adhesive member may overlap with locations where the pattern of the third adhesive layer overlaps with the second convex portions of the first adhesive layer in thickness direction.

In an exemplary embodiment, the adhesive member may include a pattern of adhesive elements, in which the pattern may include a base, a first adhesive layer disposed between an upper surface of the base and a lower surface of the panel support, and a second adhesive layer disposed between a lower surface of the base and the first circuit board.

Each of the convex portions of the adhesive member may have an island shape and the convex portions may be arranged in a first direction and a second direction perpendicular to the first direction. Each of the convex portions may have at least one of a circular shape, an elliptical shape, a rectangular shape, and a diamond shape when viewed from a top.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
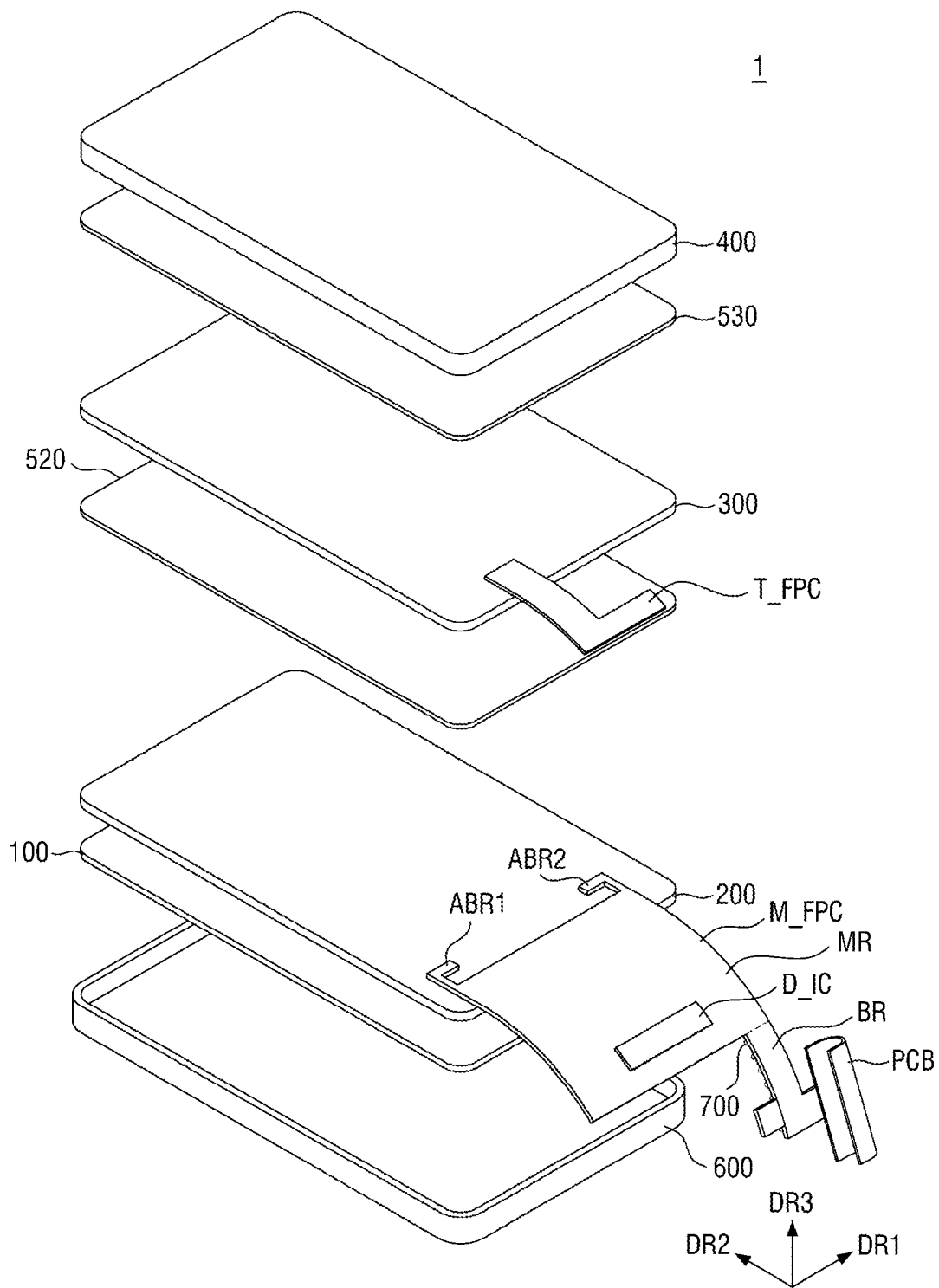
FIG. 1 is an exploded, perspective view of a display device according to an exemplary embodiment of the present invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is an exploded, perspective view of a display device according to an exemplary embodiment of the present invention.

Referring to FIG. 1, the display device 1 includes a display panel 200 and a panel sheet unit 100 disposed under the display panel 200. The display device 1 may further include a window 400 disposed on the display panel 200. In addition, the display device 1 may further include a bracket 600 disposed under the panel sheet unit 100.

As used herein, "top" and "upper surface" refers to the side of the display panel 200 in which images are displayed, whereas "bottom" and "lower surface" refers to the opposite side of the display panel 200, unless stated otherwise.

The display panel 200 is used for displaying a screen. For example, an organic light-emitting display ("OLED") panel may be employed. In the following description, the OLED panel is employed as the display panel 200. It is, however, to be understood that other types of display panels, such as a liquid-crystal display panel and an electrophoretic display panel, may also be employed.

The display panel 200 includes a plurality of organic light-emitting elements disposed on a substrate. The substrate may be a rigid substrate made of glass or the like, or a flexible substrate made of polyimide or the like. The display panel 200 may have a rectangular shape or a rectangular shape with rounded corners. It is, however, to be understood that the inventive concepts are not limited thereto. The display panel 200 may have various shapes, such as a square or other polygonal or circular shape, elliptical shape, etc. The display panel 200 may have two short sides and two long sides. For example, the display panel 200 may include two long sides extended in parallel with a second direction DR2 and two short sides extended in parallel extended in a first direction DR1 intersecting the second direction DR2.

A main circuit board M_FPC may be attached to one side of the display panel 200 and extending in the second direction DR2. The main circuit board M_FPC may be a flexible printed circuit board. FIG. 1 shows that the main circuit board M_FPC that is unfolded in one direction of the display panel 200 for convenience of illustration. The main circuit board M_FPC will be described as shown in FIG. 1. It is to be noted that when the main circuit board M_FPC is a flexible printed circuit board, the main circuit board M_FPC may be bent along the bending direction, e.g., a third direction DR3, to be attached under the panel sheet unit 100.

The main circuit board M_FPC may include a main region MR attached to the display panel 200 and a bonding region BR extended from one side of the main region MR. The main region MR may include a first auxiliary bonding region ABR1 and a second auxiliary bonding region ABR2 extended from the other side of the main region MR and attached to the display panel 200.

A data driving integrated circuit may be mounted in the main region MR. In the example shown in the drawings, data driving integrated circuit is a driving chip D_IC.

The main region MR may have a rectangular shape. The main region MR may include two long sides and two short sides. For example, the long sides of the main region MR may be parallel to at least one short side of the display panel 200. One of the long sides of the main region MR may overlap the upper surface of the display panel 200 while the other one of the long sides of the main region MR may be disposed spaced apart from, and in parallel with, the long side of the main region MR. A plurality of pad terminals (not shown) may be disposed on one side of the upper surface of the display panel 200. The main region MR of the main circuit board M_FPC may be bonded to the pad terminals.

The bonding region BR may be extended in one direction from the other long side of the main region MR. In the example shown in the drawings, the bonding region BR is extended in one direction from the edge portion of the other long side of the main region MR. It is, however, to be understood that the inventive concepts are not limited thereto. The bonding region BR may be extended in one direction from the central portion of the main region MR in the first direction DR1. The bonding region BR may be extended away from the main region MR and then may be bent and extended in a direction in parallel with the long side of the main circuit board M_FPC. The portion bent and extended in the direction parallel to the long side may further include a bonding portion to be connected to an external device such as a PCB, to be described later. The bonding portion of the main circuit board M_FPC may include a plurality of pads or bumps, so that the pads or the bumps may be attached to an external device or may be connected to an external device via a connector. In this manner, the display panel 200 can communicate with external devices. The width of the bonding region BR in the first direction DR1 may be less than the width of the main region MR in the first direction DR1.

A first adhesive member 700 may be disposed on the bonding region BR. The first adhesive member 700 may be disposed on the lower surface of the bonding region BR of the main circuit board M_FPC when the main circuit board M_FPC is disposed on the upper surface of the display panel 200. The first adhesive member 700 may attach the main circuit board M_FPC to the lower surface of the display panel 200. The first adhesive member 700 according to an exemplary embodiment of the present invention may include a plurality of adhesive patterns 703R1, 703R2 and 703R3, which will be described in detail later.

The first auxiliary bonding region ABR1 and the second auxiliary bonding region ABR2 of the main circuit board M_FPC are extended from the other edge portion of the main region MR and are attached to the display panel 200. An adhesive layer may be interposed between the first auxiliary bonding region ABR1 and the upper surface of the display panel 200 and between the second auxiliary bonding region ABR2 and the upper surface of the display panel 200, so that they can be attached to the display panel. Specifically, the first auxiliary bonding region ABR1 and the second auxiliary bonding region ABR2 may be extended from the edge portion of the longer side of the main circuit board M_FPC overlapping with the display panel 200, and then may be bent toward the center portion of the main circuit board M_FPC in the first direction DR1. The area where the first auxiliary bonding region ABR1 and the second auxiliary bonding region ABR2 are bonded to the upper surface of the display panel 200 may be different from the area where the main region MR is bonded to the upper surface of the display panel 200. Since the main circuit board M_FPC may further include the first auxiliary bonding region ABR1 and the second auxiliary bonding region ABR2, the adhesion with the display panel 200 can be improved.

A printed circuit board (PCB) may be mounted on the bonding region BR of the main circuit board M_FPC. When the main circuit board M_FPC is disposed on the lower surface of the display panel 200, the printed circuit board PCB may be disposed on the lower surface of the bonding region BR of the main circuit board M_FPC and may overlap with it in the thickness direction. On the printed circuit board PCB, a timing controller for generating a signal transmitted to a data driving integrated circuit or the like mounted on the main circuit board M_FPC is disposed.

The window 400 is disposed on the display panel 200. The window 400 is disposed on the display panel 200 to protect the display panel 200 and transmits the light exiting from the display panel 200. The window 400 may be made of glass or the like. The window 400 may be disposed to overlap the display panel 200 and cover the entire surface of the display panel 200. The window 400 may be larger than the display panel 200. For example, the window 400 may protrude outwardly from the short sides of the display panel 200. The window 400 may protrude from the long sides of the display device 200. The window 300 may protrude to a greater degree from the short sides than from the long sides.

In an exemplary embodiment, a touch element 300 may be disposed between the display panel 200 and the window 400. The touch element 300 may be of a rigid panel type, a flexible panel type, or a film type. The touch element 300 may have substantially the same size as the display panel 200 and may overlap it. The sides of the touch element 300 may be aligned with the sides of the display panel 200, for example. A touch circuit board T_FPC may be attached to one side of the touch element 300. For example, the touch circuit board T_FPC may be disposed on the side of the touch element 300 that is adjacent to the short side of the display panel 200 in the second direction DR2. The touch circuit board T_FPC may be a flexible printed circuit board containing a flexible material. When the touch circuit board T_FPC is a flexible printed circuit board, the touch circuit board T_FPC may be bent along the bending direction, e.g., the third direction DR3, and may be physically connected to the bent main circuit board M_FPC. The touch circuit board T_FPC may overlap with a part of the main circuit board M_FPC in the thickness direction at the lower surface of the display panel 200.

The display panel 200 may be coupled with the touch element 300 by a transparent coupling layer 520, and the touch element 30 may be coupled with the window 400 by a transparent coupling layer 530. Each of the transparent coupling layers 520 and 530 may include an optical transparent adhesive (OCA) and an optical transparent resin (OCR). The touch element 300 may be eliminated. When there is no touch element, the display panel 200 may be coupled with the window 400 by an optical transparent adhesive (OCA), an optical transparent resin (OCR), or the like. In some exemplary embodiment of the present invention, the display panel 200 may include a touch electrode structure.

The panel sheet unit 100 may be disposed under the display panel 200. The panel sheet unit 100 may include a top coupling layer 130 (see FIG. 3) at the top and may be attached to the lower surface of the display panel 200 through the top coupling layer 130. Although the top coupling layer 130 is described as being included in the panel sheet unit 100 in the exemplary embodiment, a top coupling layer at the same position may be included in another adjacent element or a top coupling layer may be a separated element.

According to an exemplary embodiment of the present invention, the panel sheet unit 100 may include a first sheet 120, a second sheet 110, and a third sheet 111 in addition to the top coupling layer 130. The panel sheet unit 100 will be described later.

A bracket 600 is disposed below the panel sheet unit 100. The bracket 600 accommodates the window 400, the touch element 300, the display panel 200, and the panel sheet unit 100. Further, the bracket 600 may accommodate the main circuit board M_FPC, the printed circuit board PCB, and the touch circuit board T_FPC attached to the display panel 200 and the touch element 300. The bracket 600 may include a bottom face and side walls. The bottom face of the bracket 600 faces the lower surface of the panel sheet face 100, and the side walls of the bracket 600 face the window 400, the touch element 300, the display panel 200, and the panel sheet unit 100. The panel sheet unit 100 may include a bottom coupling element (not shown) at its bottom and may be attached to a part of the bottom face of the bracket 600 via the bottom coupling element.

Hereinafter, the panel sheet unit and a plurality of circuit boards disposed under the display panel will be described in more detail.

Figure 2:
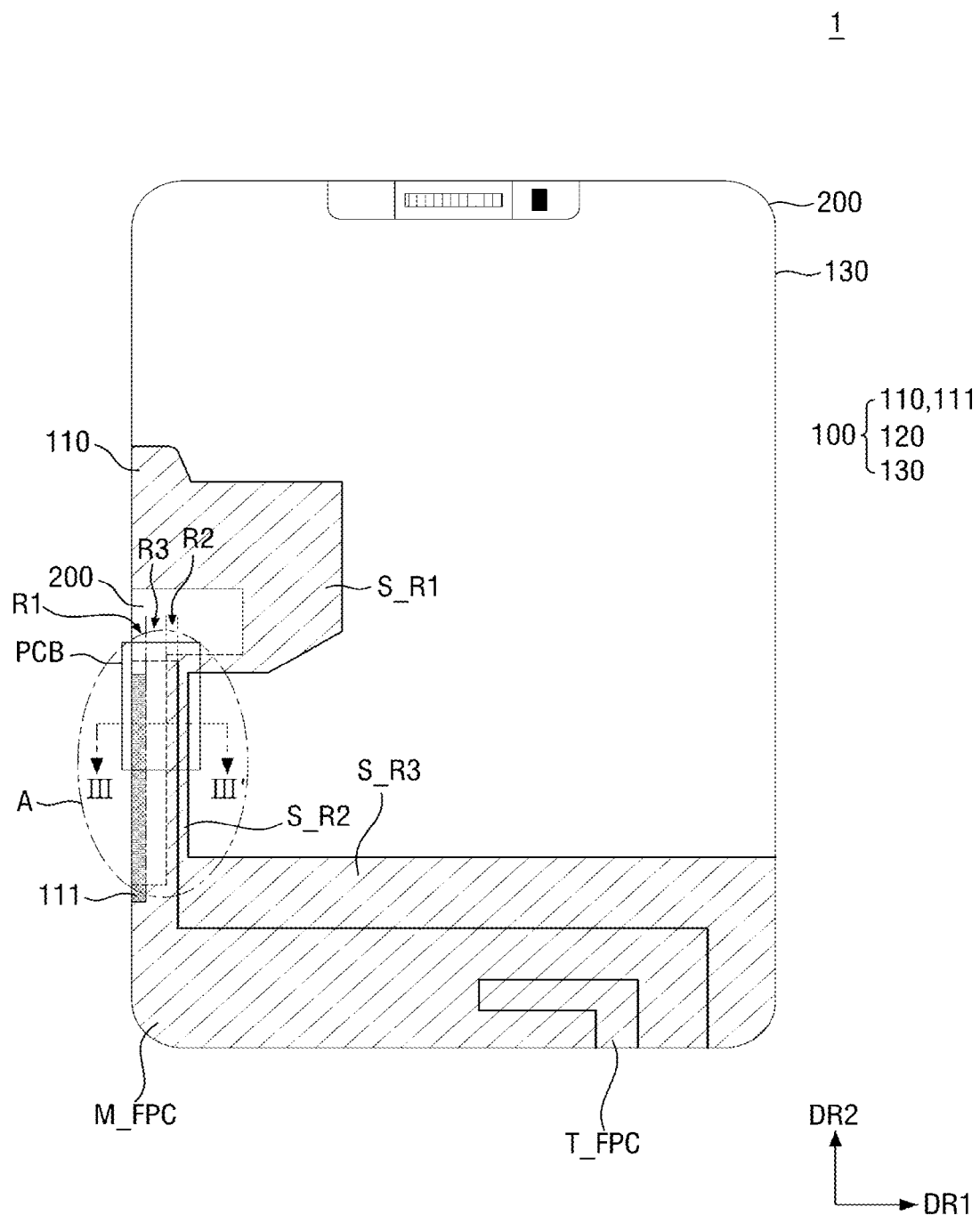
FIG. 2 is a view showing the layout of the rear face of the display device of FIG. 1.
Figure 3:
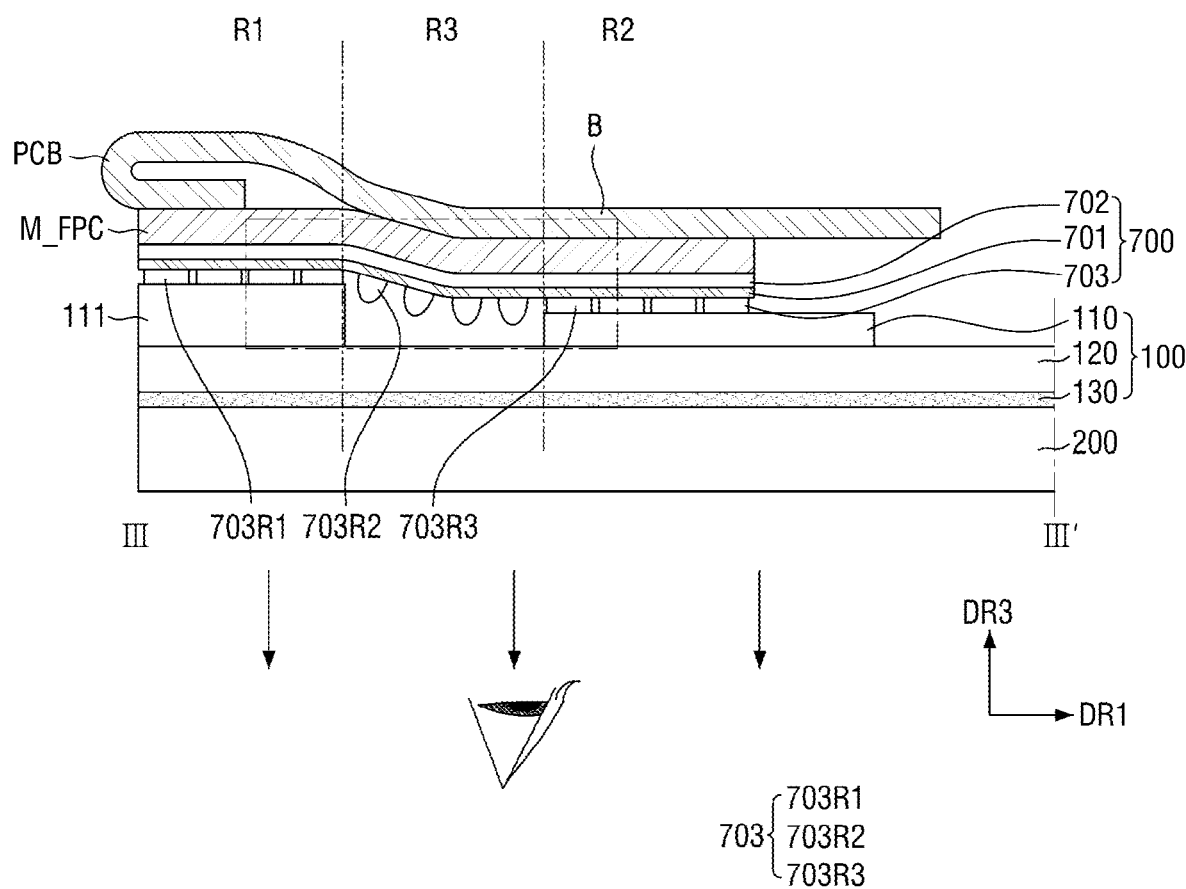
FIG. 3 is a cross-sectional view taken along line III-III' of FIG. 2.

FIG. 2 is a view showing the layout of the rear face of the display device of FIG. 1. FIG. 3 is a cross-sectional view taken along line III-III' of FIG. 2.

Referring to FIGS. 2 and 3, the panel sheet unit 100 disposed on the lower surface of the display panel 200 may include the top coupling layer 130, the first sheet 120, the second sheet 110, and the third sheet 111.

The top coupling layer 130 is disposed on the lower surface of the display panel 200. The top coupling layer 130 serves to attach the panel sheet unit 100 to the lower surface of the display panel 200. In the drawings, the top coupling layer 130 is shown as being disposed on the entire lower surface of the display panel 200. Thus, one side of the top coupling layer 130 may be aligned with one side of the display panel 200 in the thickness direction. The top coupling layer 130 may include an adhesive layer or a resin layer. For example, the top coupling layer 130 may contain a polymer material that is sorted into a silicone polymer, a urethane polymer, an SU polymer having silicone-urethane hybrid structure, an acrylic polymer, an isocyanate polymer, a polyvinyl alcohol polymer, a gelatin polymer, a vinyl polymer, a latex polymer, polyester polymer, water-based polyester polymer, etc.

The first sheet 120 is disposed on the lower surface of the top coupling layer 130. The first sheet 120 may block undesirable signal communications between the display panel 100 and the main circuit board M_FPC, the touch circuit board T_FPC and the like attached to the lower surface of the display panel 100. According to an exemplary embodiment of the present invention, the first sheet 120 may overlap with the bottom face of the display panel 200 in the thickness direction, like the top bonding layer 130. The side surfaces of the first sheet 120 may be aligned with the side surfaces of the top coupling layer 130 and the display panel 200. The first sheet 120 may be an electromagnetic wave shielding layer. The first sheet 120 may include a thin metal film such as copper (Cu), aluminum (Al), gold (Au) and silver (Ag).

The second sheet 110 is disposed on the lower surface of the first sheet 120. The second sheet 110 may perform a heat radiation function. The second sheet 110 may be a heat dissipation layer. In an exemplary embodiment, the second sheet 110 may include a material such as graphite and carbon nanotubes (CNT). In an exemplary embodiment, the second sheet 110 may be smaller than the first sheet 120 and the top coupling layer 130 when viewed from the top. Therefore, the side surfaces of the second sheet 110 may be formed more to the inside than the side surfaces of the first sheet 120, the top coupling layer 130 and the display panel 100.

The second sheet 110 may include three regions that have different profiles and thus, are distinguished from one another when viewed from the top. For example, the second sheet 110 may include a first sheet region S_R1, a second sheet region S_R2, and a third sheet region S_R3 that are disposed adjacent to one another in the second direction DR2. The first sheet region S_R1 may be disposed at the highest location in the second direction DR2 when viewed from the top. The first sheet region S_R1 may have a generally rectangular region and may further include a portion extended in the second direction DR2 with a predetermined width from the lower side of the rectangular region in parallel to the first direction DR1, and a portion extended toward the longer side of the display panel 200 adjacent thereto in the first direction DR1 from the portion extended in the second direction DR2. The second sheet region S_R2 may be extended from the end of the first sheet region S_R1 with a predetermined width. The width of the second sheet region S_R2 in the first direction DR1 may be generally smaller than the width of the first sheet area S_R1 in the first direction DR1. The third sheet region S_R3 may be extended from the end of the second sheet region S_R2 with a predetermined width and may have a generally rectangular shape. The width of the third sheet region S_R3 in the first direction DR1 may be greater than the width of the first sheet region S_R1 and the width of the second sheet area S_R2 in the first direction DR1. It is, however, to be understood that the inventive concepts are not limited thereto. The second sheet 110 may have various profiles when viewed from the top.

The third sheet 111 may be disposed on the first sheet 120 and may be separated from the second sheet 110. The third sheet 111 may be disposed on a part of the first sheet 120, not on the entire surface of the first sheet 120. The third sheet 111 may include any of the above-described functional layers of the panel sheet unit 100. It is to be understood that the third sheet 111 is not limited to that shown in FIGS. 2 and 3 but may have a larger or smaller width in the first and second directions DR1 and DR2. Further, the third sheet 111 is not limited to the thickness shown. Although the third sheet 111 is shown as being thicker than the second sheet 110 in the drawings, it is merely illustrative. The third sheet 111 may have a substantially the same or smaller thickness. In some exemplary embodiments, the third sheet 111 may be eliminated.

It is to be noted that the structures, functions, materials and the like of the first sheet 120, the second sheet 110, and the third sheet 111 are not limited to those described above. For example, each of the first sheet 120, the second sheet 110, and the third sheet 111 may include at least one layer of the layers that perform a heat dissipating function, an electromagnetic wave shielding function, a pattern covering function, a grounding function, a buffering function, and strength enhancing function and/or a digitizing function. In this case, each of the first sheet 120, the second sheet 110, and the third sheet 111 may be made up of one of the above-described functional layers or may be made up of multiple layers formed by stacking two or more of the above-described functional layers. When two or more sheets 110, 111, and 120 are stacked on one another, the sizes of the layers may be equal. It is, however, to be understood that the inventive concepts are not limited thereto. They may have different sizes, so that at least one side of at least one layer may protrude from the layer adjacent thereto in the thickness direction. As such, the size of the panel sheet unit 100 when viewed from the top may vary, and is not limited to that shown in FIG. 1.

Referring to area A shown in FIG. 2, the lower surface of the display panel 100 may include a first region R1 where the third sheet 111 is disposed, a second region R2 where the second sheet 110 is disposed, and a third region R3 where the first sheet 120 is exposed. Herein, the bottom structure of the display panel 100, that is, the panel sheet unit 100 may be referred to as a panel support.

The first region R1 to the third region R3 may be adjacent to one another. Level differences may be created by the structures stacked on one another sequentially from the first region R1 to the third region R3 under the display panel 100. For example, since the thicknesses of the first region R1 and the second region R2 are greater than the thickness of the third region R3, the levels of the first region R1 and the second region R2 may be higher than the level of the third region R3. Specifically, the thickness of the first region R1 may be greater than the third region R3 by the thickness of the third sheet 111. In addition, the thickness of the second region R2 may be greater than the third region R3 by the thickness of the second sheet 110. Furthermore, the level difference at the first region R1 may be different from the level difference at the second region R2.

The level differences from the first region R1 to the third region R3 in area A, especially the level differences between the first region R1 and the third region R3 and between the second region R2 and the third region R3 may be viewed from the outside through the display surface as mura. A detailed description thereof will be made later.

The main circuit board M_FPC may be attached to the lower surfaces of the second sheet 110 and the third sheet 111. The main circuit board M_FPC may be attached to the lower surfaces of the second sheet 110 and the third sheet 111 through the first adhesive member 700 disposed in the bending region BR of the main circuit board M_FPC. A printed circuit board PCB may be attached to the lower surface of the main circuit board M_FPC. Some areas including one end of the printed circuit board PCB may be attached on the area of the main circuit board M_FPC that overlaps with the third sheet 111 in the thickness direction, i.e., on the first region R1. The printed circuit board PCB is extended in the first direction DR1 of the main circuit board M_FPC as it is unfolded. When the printed circuit board PCB is mounted on the bracket 600, one end of the printed circuit board PCB is fixed in the first region R1, and the printed circuit board PCB is bent along the bending direction, such that the other end of the printed circuit board PCB generally overlaps with the second region R2 and may be further extended out of the second region R2 in the first direction DR1. It may be disposed on an area adjacent to the second sheet 110.

Hereinafter, the first adhesive member 700 will be described in detail with reference to FIGS. 4A to 4I and FIG. 5.

FIGS. 4A to 4I are plan views showing the layouts of a main circuit board before it is attached to a display panel support according to an exemplary embodiment of the present invention and modifications thereof. FIG. 5 is an enlarged, cross-sectional view of area B of FIG. 3.

Figure 4A:
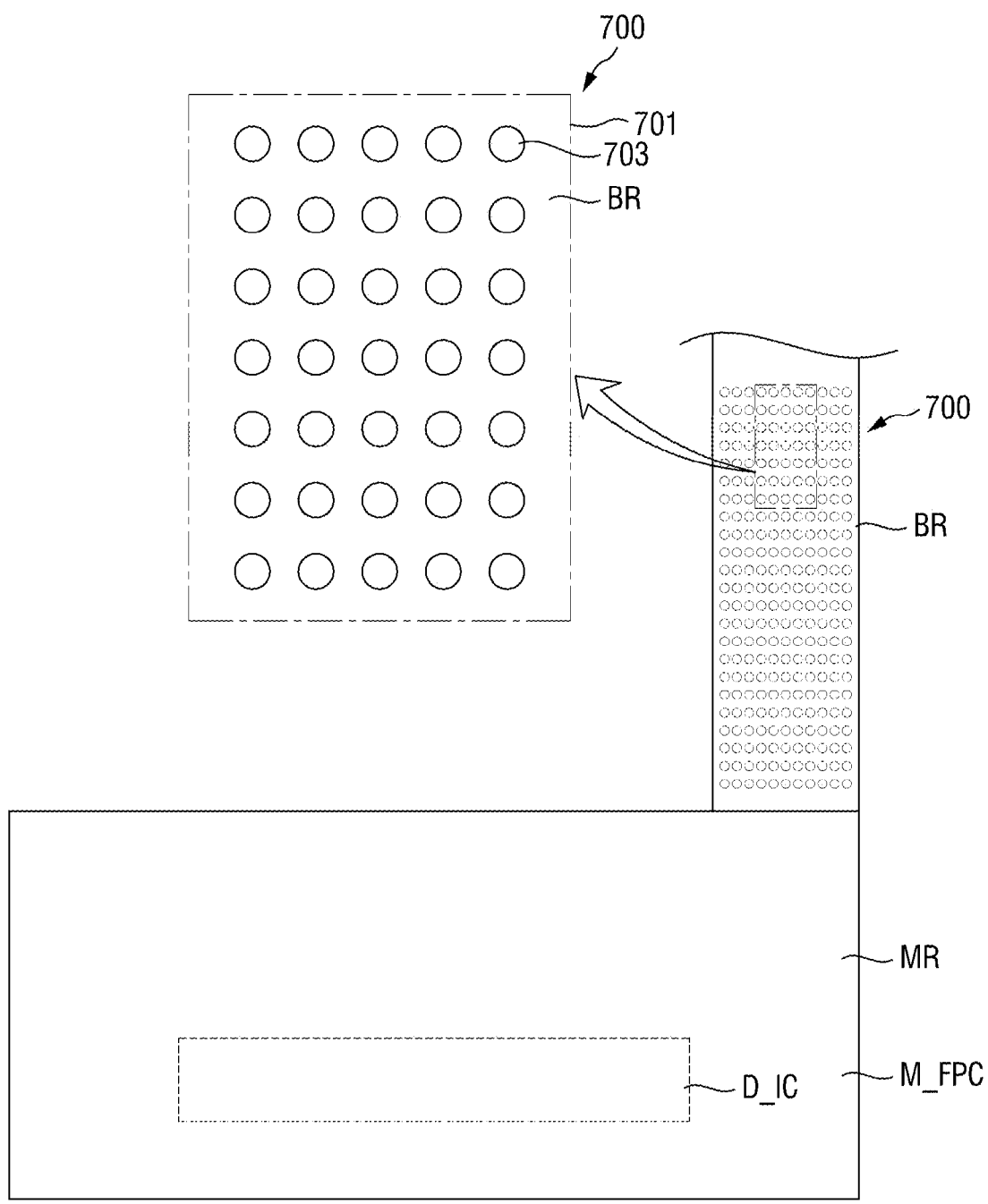
FIG. 4A, FIG. 4B, FIG. 4C, FIG. 4D, FIG. 4E, FIG. 4F, FIG. 4G, FIG. 4H, and FIG. 4I are plan views showing the layouts of a main circuit board before it is attached to a display panel support according to an exemplary embodiment of the present invention and modifications thereof.
Figure 5:
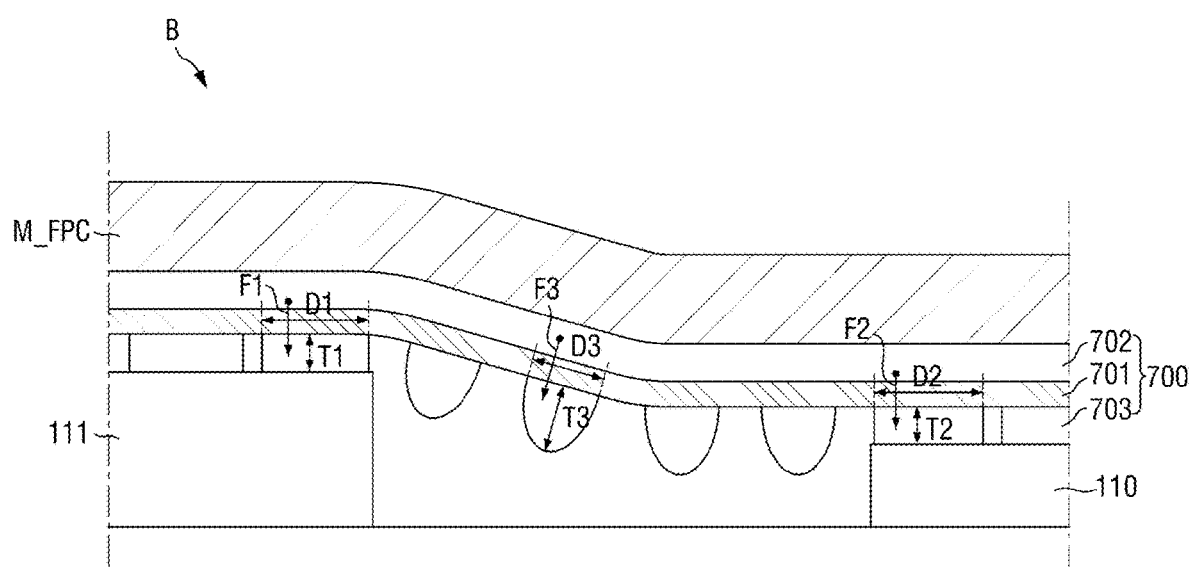
FIG. 5 is an enlarged, cross-sectional view of area B of FIG. 3.

Referring to FIGS. 4A and 5, the first adhesive member 700 according to the exemplary embodiment of the present invention may include a pattern of adhesive elements on the upper surface of the main circuit board M_FPC. The first adhesive member 700 may include a tape base 701, a first adhesive layer 702, and a second adhesive layer 703. The adhesive member 700 may be, for example, a double-sided tape. The tape base 701 may be made of, for example, polyethylene terephthalate (PET), polyimide (PI), polycarbonate (PC), polyethylene (PE), polypropylene (PP), polysulfone (PSF), polymethylmethacrylate (PMMA), triacetylcellulose (TAC), cycloolefin polymer (COP), etc. The first and second adhesive layers 702 and 703 may be made of the materials listed above as the material of the top coupling layer 130. The first adhesive layer 702 may be directly attached to the main circuit board M_FPC. The second adhesive layer 703 may be disposed on the upper surface of the tape base 701 and may include a pattern of adhesive elements and in turn an irregular surface. The adhesive elements of the pattern may be convex portions of the first adhesive member 700. The locations where the plurality of adhesive elements is not disposed may form the concave portions of the first adhesive member 700. The upper surface of the tape base 701 may be exposed to the outside at the concave portions of the first adhesive member 700. The adhesive elements of the pattern of the second adhesive layer 703 may be spaced apart from one another along one of the long sides of the main circuit board M_FPC. Further, the adhesive elements may be spaced apart from one another along one of the short sides of the main circuit board M_FPC. In this case, the adhesive elements may be arranged on the main circuit board M_FPC with a substantially constant density distribution. As used herein, the density distribution is defined as the number of elements of the pattern per area. In other words, the number of the adhesive elements of the pattern of the first adhesive member 700 per area may be constant at any area on the upper surface of the main circuit board M_FPC. The adhesive elements of the pattern of the first adhesive member 700 all may have substantially the same shape, width, and thickness. In the drawings, the adhesive elements of the pattern of the first adhesive member 700 have an island-like shape. The adhesive elements of the pattern of the first adhesive member 700 may be equally spaced apart from one another in the long side direction and in the short side direction of the main circuit board M_FPC.

Figure 4B:
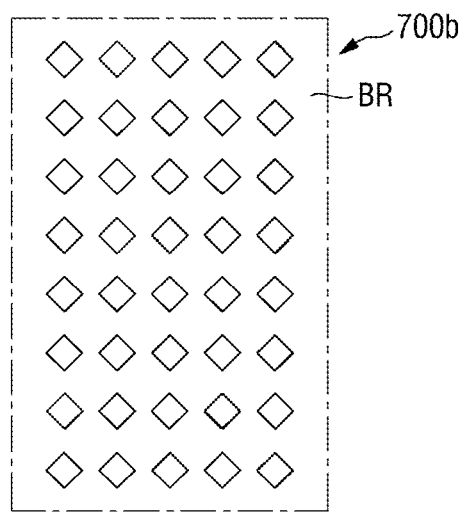
Figure 4C:
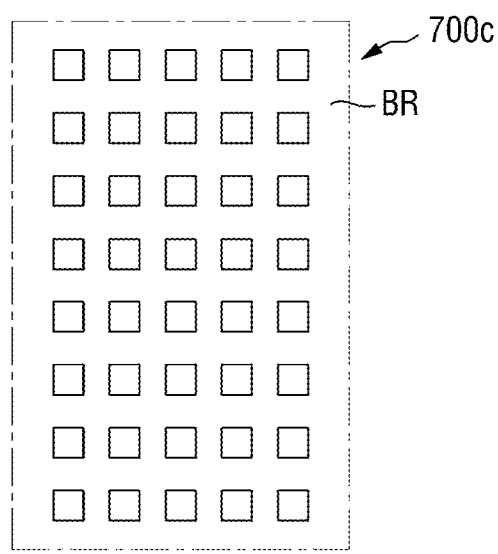
Figure 4D:
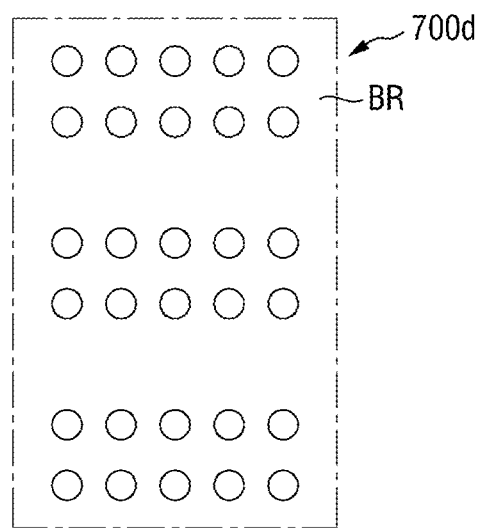
Figure 4E:
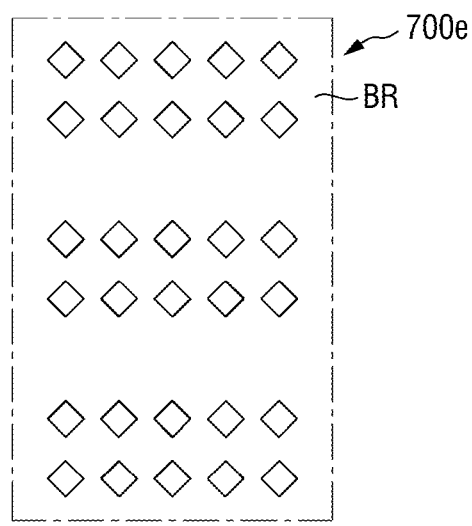
Figure 4F:
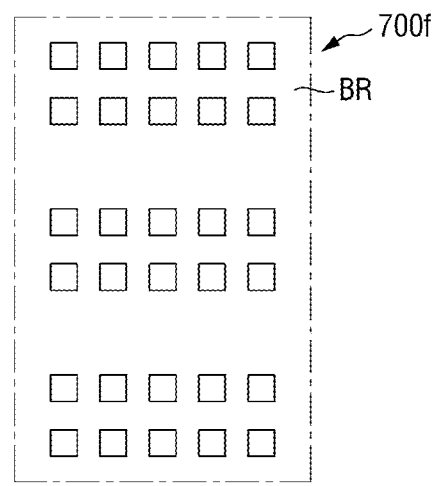

The adhesive elements of the pattern of the first adhesive member 700 may have a circular shape when viewed from the top. It is, however, to be understood that the inventive concepts are not limited thereto. Each of the elements of the pattern of the first adhesive member 700 may have a variety of shapes such as a diamond, an ellipse, a square and a rectangle. Referring to FIGS. 4B and 4C, each of the adhesive elements 700b of the pattern of the second adhesive layer may have a diamond shape, while each of the adhesive elements 700c of the pattern of the second adhesive layer may have a square shape. Referring to FIGS. 4D to 4F, the adhesive elements of each of the second adhesive layers 703d, 703e, and 703f are not arranged such that they are equally spaced apart from one another in the long side direction and in the short side direction of the main circuit board M_FPC. Instead, the elements may be arranged such that the spacing distance in the longer side direction of the main circuit board M_FPC is greater than or less than the spacing distance in the short side direction of the main circuit board M_FPC. In addition, the adhesive elements arranged in the long side direction of the main circuit board M_FPC may form rows. The rows of the adhesive elements may get close to form a pattern group. The number of rows forming the pattern group is not particularly limited. In this case, the spacing distance between the pattern groups in the short side direction may be greater than the spacing distance between the rows of the adhesive elements.

Figure 4G:
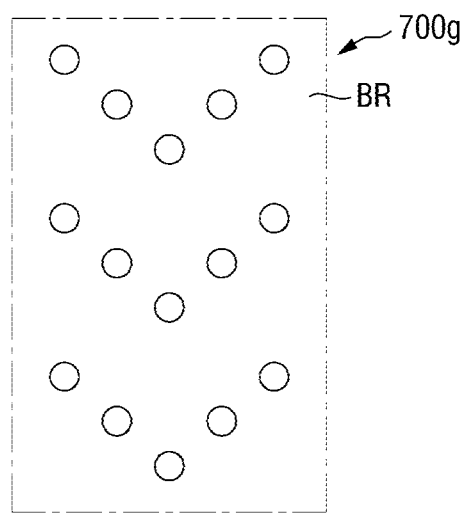
Figure 4H:
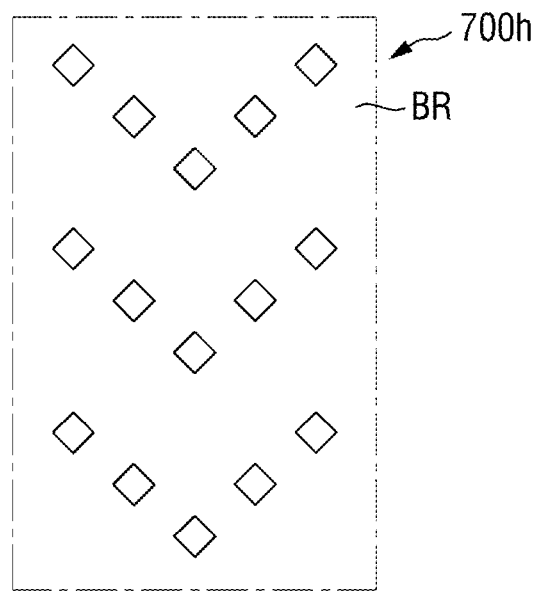
Figure 4I:
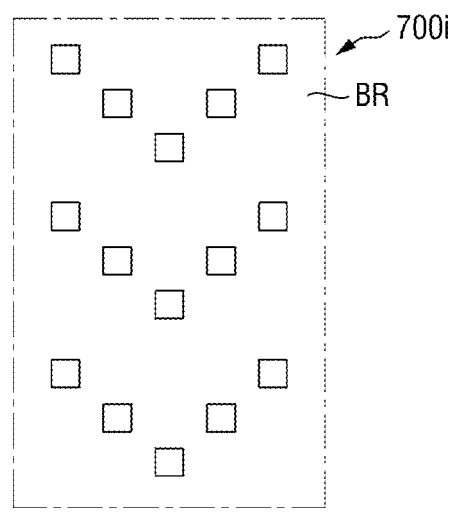

Referring to FIGS. 4G to 4I, the adhesive elements arranged in the short side direction of the main circuit board M_FPC form columns. For example, columns may be arranged in the shorter side direction of the main circuit board M_FPC with a predetermined spacing distance, and each of the adhesive elements of one column may be disposed between every two adhesive elements of the adhesive column.

According to an exemplary embodiment of the present invention, the first adhesive member 700 may be made of a pressure sensitive adhesive (PSA) comprising a pressure sensitive material. Each of the adhesive elements may contain air bubbles therein before a pressure higher than a certain value is applied. Such adhesive elements of the pattern are subjected to a pressure above a certain level while they are attached to adjacent features. When this happens, air bubbles therein are removed so that the shape of the first adhesive member 700 changed. As a result, they are arranged more densely than before a pressure above certain level is applied, and accordingly the adhesive strength with the adjacent features can be increased. According to an exemplary embodiment of the present invention, the first adhesive member 700 may not be entirely attached to the panel supports.

The first adhesive member 700 may include a first adhesive pattern 703R1, a second adhesive pattern 703R2, and a third adhesive pattern 703R3. The plurality of adhesive patterns 703R1, 703R2, and 703R3 of the first adhesive member 700 may be disposed from the first region R1 to the third region R3 on the upper surface of the main circuit board M_FPC. Each of the adhesive patterns 703R1, 703R2 and 703R3 may have different widths, thicknesses, adhesion to the main circuit board M_FPC and the features thereon.

As described above, the first adhesive member 700 may not be entirely attached to the panel supports. Specifically, while the first adhesive pattern 703R1 and the second adhesive pattern 703R2 are attached to the third sheet 111 and the second sheet 110 thereon, respectively, the third adhesive pattern 703R3 is not directly attached to the first sheet 120 exposed in the third region R3 due to the level differences between the first region R1 and the third region R3 and between the second region R2 and the third region R3, which has been described above.

More specifically, as the first and second adhesive patterns 701 and 702 are attached to the third sheet 111 and the second sheet 110 thereon, respectively, the first thickness T1 and the second thickness T2 may be less than the third thickness T3 of the third adhesive pattern 703R3. In addition, as the first and second adhesive patterns 701 and 702 are attached to the features thereon, the widths are increased, such that the first width D1 and the second width D2 of the first and second adhesive patterns 701 and 702 may be greater than the third width D3 of the third adhesive pattern 703R3.

In addition, the first adhesive pattern 703R1 and the second adhesive pattern 703R2 are coupled with the third sheet 111 and the second sheet 110 thereon, respectively, in the first region R1, while the third adhesive pattern 703R3 is not coupled with the first sheet 120 in the third region R3, such that they may have different coupling forces. For example, a first coupling force F1 between the lower surface of the first adhesive pattern 703R1 and the main circuit board M_FPC may be substantially equal to a second coupling force F2 between the lower surface of the second adhesive pattern 703R2 and the main circuit board M_FPC, and may be greater than a third coupling force F3 between the lower surface of the third adhesive pattern 703R3 and the main circuit board M_FPC. In addition, the second coupling force F2 between the lower surface of the second adhesive pattern 703R2 and the main circuit board M_FPC may be greater than the third coupling force F3 between the lower surface of the third adhesive pattern 703R3 and the main circuit board M_FPC.

The first adhesive member 700 including the plurality of adhesive patterns 703R1, 703R2 and 703R3 may not only attach the main circuit board M_FPC thereunder to various panel supports disposed thereon but also suppress mura due to the level differences between the panel supports from being seen. Such effects will be described in detail with reference to FIG. 7.

Figure 6:
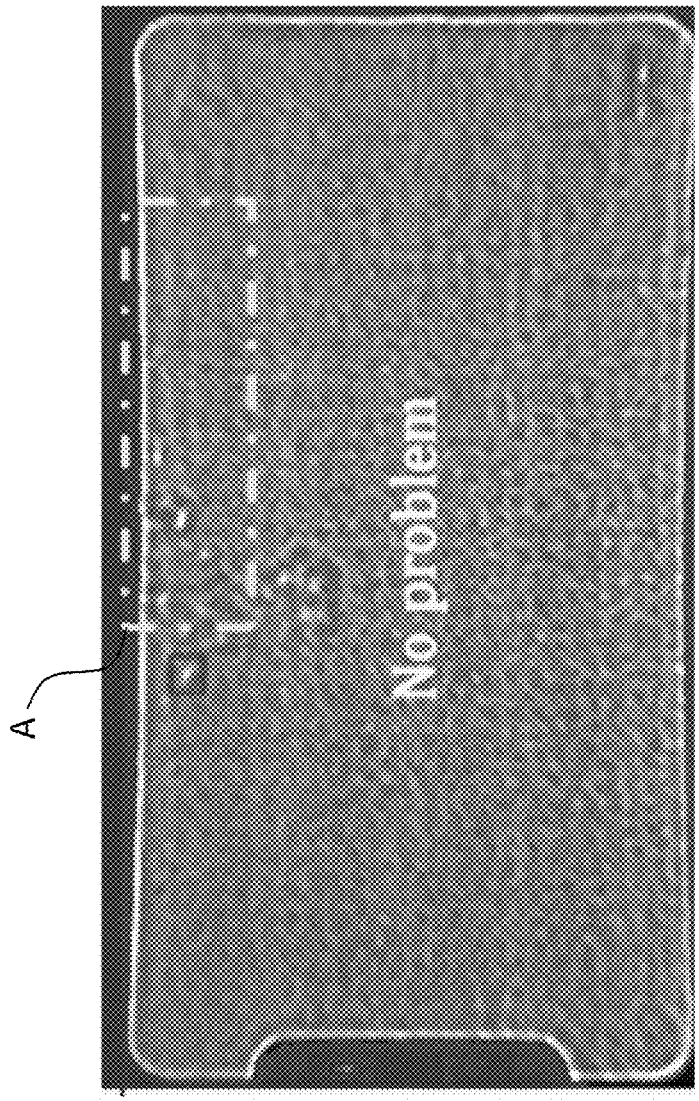
FIG. 6 is a view showing area A of FIG. 2 when a main circuit board according to an exemplary embodiment of the present invention is employed.

FIG. 6 is a view showing area A of FIG. 2 when a main circuit board according to an exemplary embodiment of the present invention is employed.

As described above, in area A of FIG. 2, there may be level differences from the first region R1 to the third region R3. When the adhesive layer is formed as a single piece and disposed on the entire upper surface of the main circuit board M_FPC, the level differences may be seen from the outside as mura through the display surface in area A. Specifically, the portion having the level difference between the first region R1 and the third region R3 and between the second region R2 and the third region R3 has a lower brightness than the other portions where no level difference is created. Since different portions have differences in brightness, mura may be seen from the outside. In this regard, on the lower surface in the first region R1 to the third region R3 where the level differences are created, by disposing the plurality of adhesive patterns 703R1, 703R2 and 703R3 attached to the main circuit board M_FPC, it is possible to significantly suppress the level differences from being seen from the outside through the display surface, as shown in FIG. 6.

In addition, if an adhesive layer is formed on the entire upper surface of the main circuit board M_FPC and the main circuit board M_FPC is attached to various features thereon through the adhesive layer, the adhesive layer may stick together and/or may wrinkle, such that the adhesion between the main circuit board M_FPC and these features may become weak. In contrast, by employing the first adhesive member 700 including the adhesive patterns 703R1, 703R2 and 703R3 according to the exemplary embodiment of the present invention, it is possible to suppress the adhesive layer from sticking together and/or wrinkling. As a result, it is possible to prevent the adhesion between the main circuit board M_FPC and the various features thereon from becoming weak.

Hereinafter, panel sheet units according to other exemplary embodiments of the present invention will be described. In the following description, the same or similar elements will be denoted by the same or similar reference numerals, and redundant descriptions will be omitted or briefly described. Descriptions will be made focusing on differences from the above exemplary embodiment.

Figure 7:
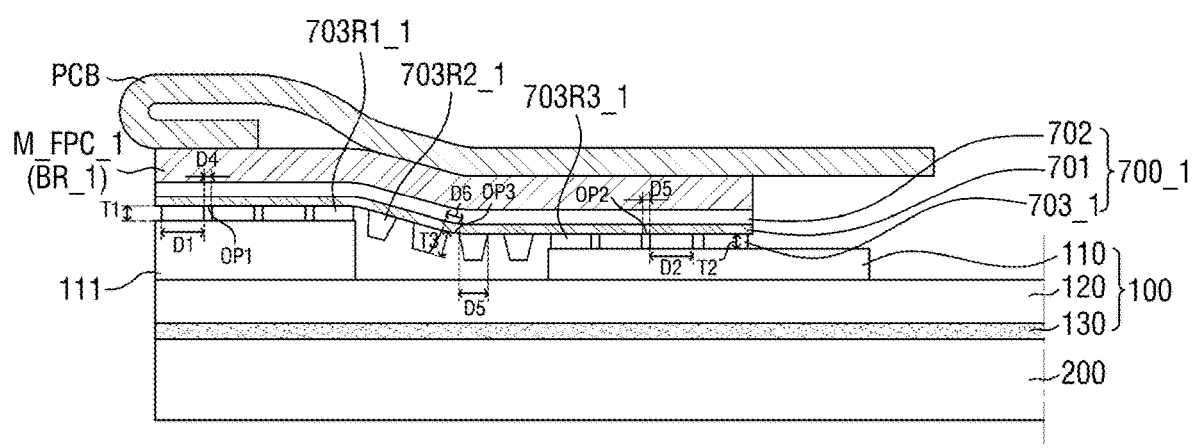
FIG. 7 is a cross-sectional view of a display device according to another exemplary embodiment of the present invention.
Figure 7:
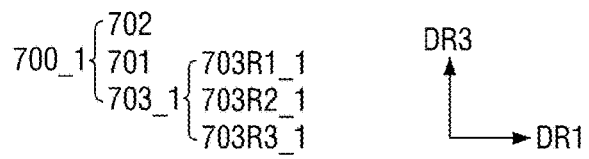

FIG. 7 is a cross-sectional view of a display device according to another exemplary embodiment of the present invention.

A first adhesive member 700_1 according to the exemplary embodiment shown FIG. 7 differs from the first adhesive member 700 according to the exemplary embodiment shown in FIGS. 1 to 5 in that the first adhesive member 700_1 is formed via a depressing process.

More specifically, an adhesive layer is disposed on the entire upper surface of the main circuit board P_FPC_1 via a coating process or the like. Subsequently, the adhesive layer may be subjected to an etching process or the like for depressing process, to have a shape like the first adhesive member 700_1. By performing the depressing process, the first adhesive member 700_1 may have a first opening OP1 in the first region R1, a second opening OP2 in the second region R2, and a third opening OP3 in the third region R3.

The first width D1 of the first adhesive pattern 703R1_1 and the second width D2 of the second adhesive pattern 703R2_1 may be greater than the third width D3 of the third adhesive pattern 703_1. The first thickness T1 of the first adhesive pattern 703R1_1 and the second thickness T2 of the second adhesive pattern 703R2_1 may be less than the third thickness T3 of the third adhesive pattern 703R3_1. The width D4 of the first opening OP1 and the width D5 of the second opening OP2 may be less than the width D6 of the third opening OP3.

Also in this exemplary embodiment, there may be level differences from the first region R1 to the third region R3. When the adhesive layer is formed as a single piece and disposed on the entire upper surface of the main circuit board P_FPC_1, the level differences may be seen from the outside through the display surface. In this regard, on the lower surface in the first region R1 to the third region R3 where the level differences are created, by disposing the plurality of adhesive patterns 703R1_1, 703R2_1 and 703R3_1 of the main circuit board P_FPC_1 and by attaching the main circuit board P_FPC_1 through the adhesive patterns 703R1_1, 703R2_1 and 703R_1, it is possible to significantly suppress the level differences from being seen from the outside through the display surface.

In addition, if an adhesive layer is formed on the upper surface of the main circuit board P_FPC_1 and the main circuit board P_FPC_1 is attached to various features thereon through the adhesive layer, the adhesive layer formed on the entire surface may stick together and/or may wrinkle, such that the adhesion between the main circuit board P_FPC_1 and these features may become weak. In contrast, by employing the first adhesive member 700_1 including the adhesive patterns 703R1_1, 703R2_1 and 703R3_1 according to the exemplary embodiment of the present invention, it is possible to suppress the adhesive layer from sticking together and/or wrinkling. As a result, it is possible to prevent the adhesion between the main circuit board P_FPC_1 and the various features thereon from becoming weak.

Figure 8:
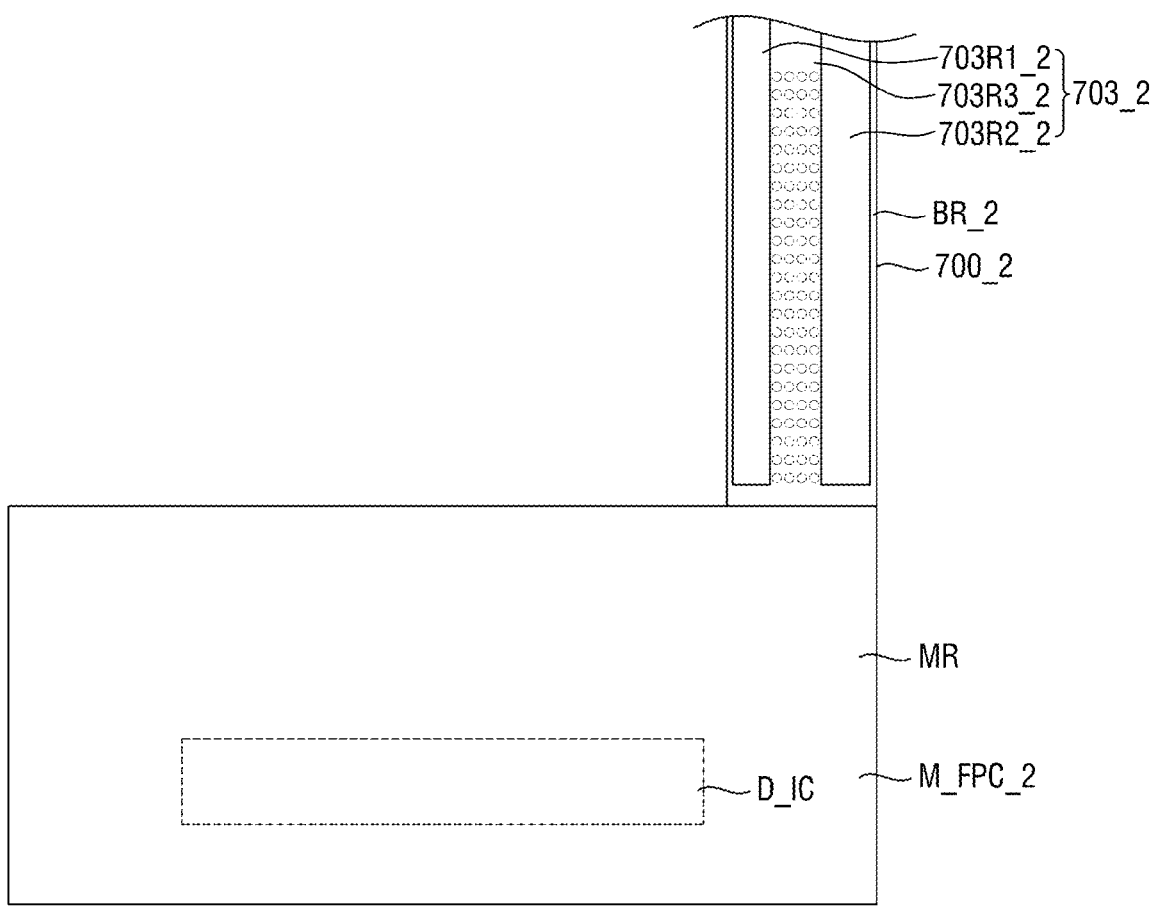
FIG. 8 is a plan view showing the layout of a main circuit board according to yet another exemplary embodiment of the present invention.
Figure 9:
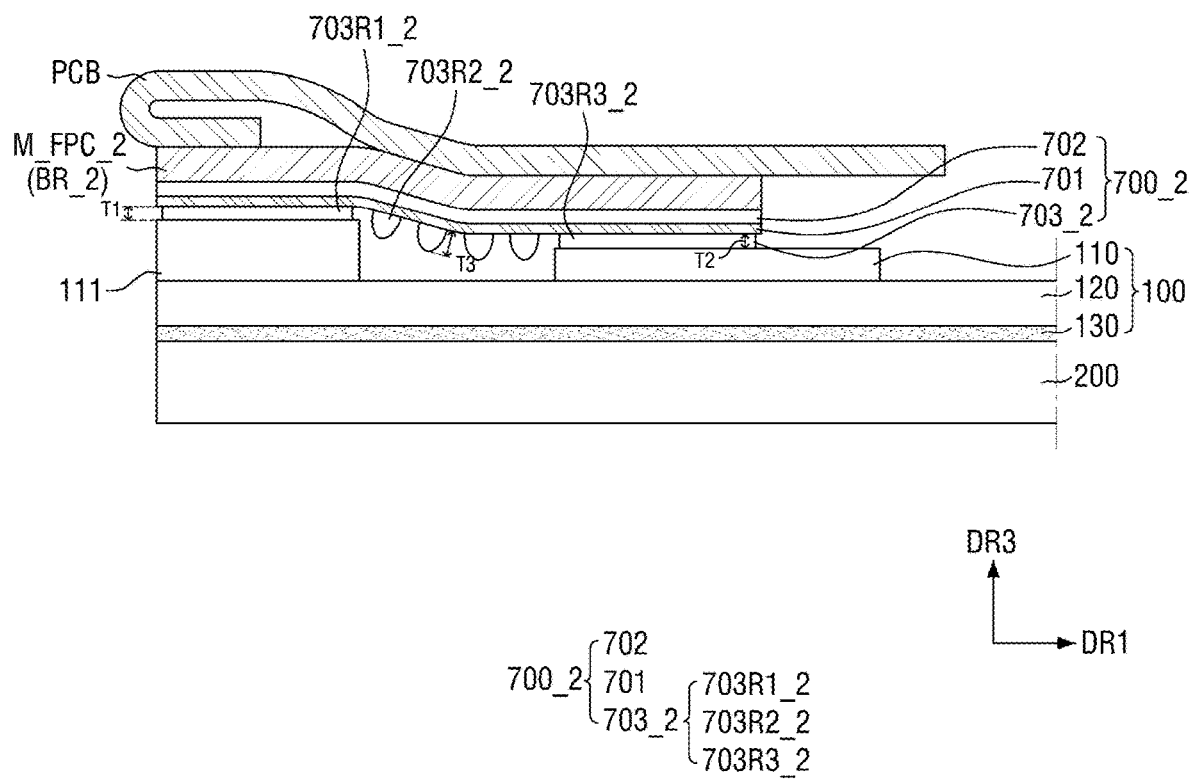
FIG. 9 is a cross-sectional view of a display device according to yet another exemplary embodiment of the present invention.

FIG. 8 is a plan view showing the layout of a main circuit board according to yet another exemplary embodiment of the present invention. FIG. 9 is a cross-sectional view of a display device according to yet another exemplary embodiment of the present invention.

A first adhesive member 700_2 according to the exemplary embodiment shown in FIGS. 8 and 9 differs from the first adhesive member 700 according to the exemplary embodiment shown in FIGS. 1 to 5 in that a first adhesive pattern 703R1_2 and a second adhesive pattern 703R2_2 are formed integrally in the first region R1 and the second region R2.

More specifically, the first adhesive member 700_2 may include the first adhesive pattern 703R1_2 and the second adhesive pattern 703R2_2 integrally formed in the first region R1 and the second region R2. A main circuit board M_FPC_2 may be attached to a third sheet 111 and a second sheet 111 via the first adhesive pattern 703R1_2 and the second adhesive pattern 703R2_2, respectively, in the first region R1 and the second region R2.

By employing the first adhesive pattern 703R1_2 and the second adhesive pattern 703R2_2 according to this exemplary embodiment of the present invention, it is possible to improve the adhesion between the upper surface of the main circuit board M_FPC_2 and the first region R1 and the second region R2.

Also in this exemplary embodiment, there may be level differences from the first region R1 to the third region R3. When the adhesive layer is formed as a single piece and disposed on the entire upper surface of the main circuit board P_FPC_2, the level differences may be seen from the outside through the display surface. In this regard, in the second region R2 where the level differences are created, by disposing the third adhesive pattern 703R3_2 of the main circuit board M_FPC_2 on the lower surface of the second region R2 and by attaching the main circuit board M_FPC_2 to the lower surface of the first region R1 and the second region R2 through the first and second adhesive patterns 703R1_2 and 703R2_2, it is possible to significantly suppress the level differences from being seen from the outside through the display surface.

In addition, if an adhesive layer is formed on the entire upper surface of the main circuit board M_FPC_2 and the main circuit board M_FPC_2 is attached to various features thereon through the adhesive layer, the adhesive layer may stick together and/or may wrinkle, such that the adhesion between the main circuit board M_FPC_2 and these features may become weak. In contrast, by employing the first adhesive member 700_2 including the third adhesive pattern 703R3_2 according to the exemplary embodiment of the present invention, it is possible to suppress the adhesive layer from sticking together and/or wrinkling, compared to the adhesive layer formed entirely. As a result, it is possible to prevent the adhesion between the maintain circuit board M_FPC_2 and the various features thereon from becoming weak.

Figure 10:
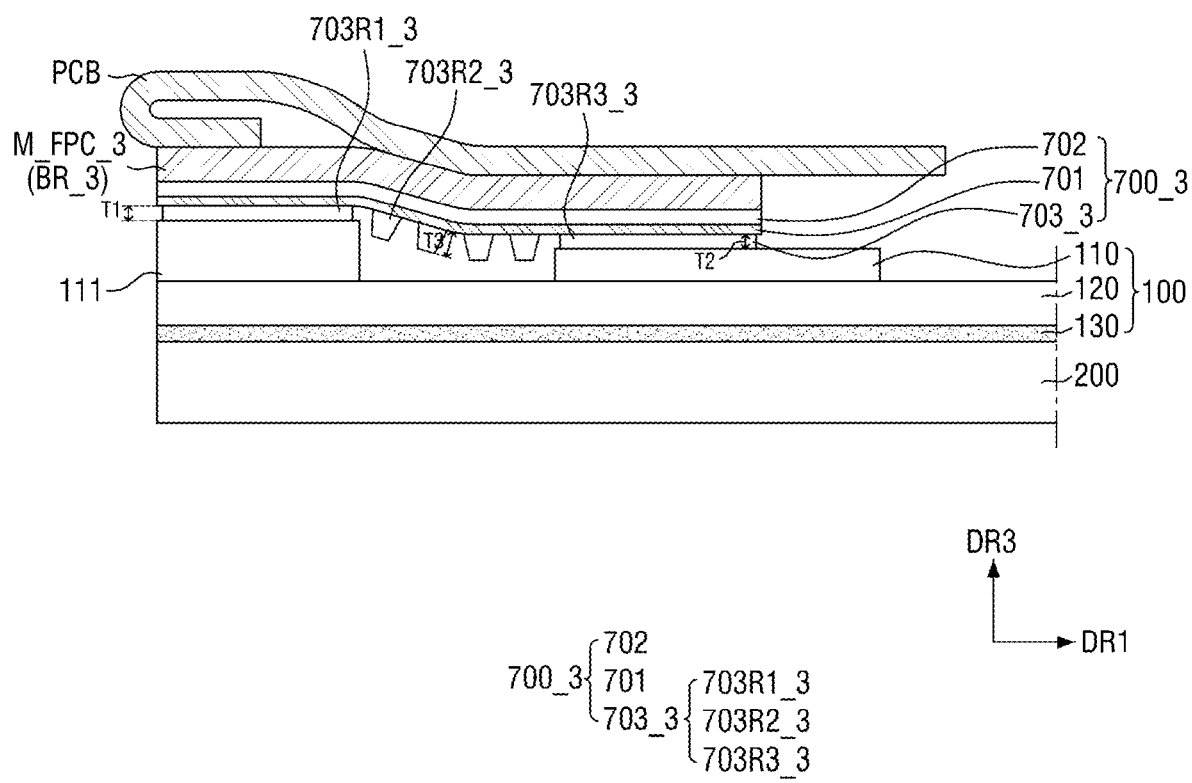
FIG. 10 is a cross-sectional view of a display device according to yet another exemplary embodiment of the present invention.
Figure 11:
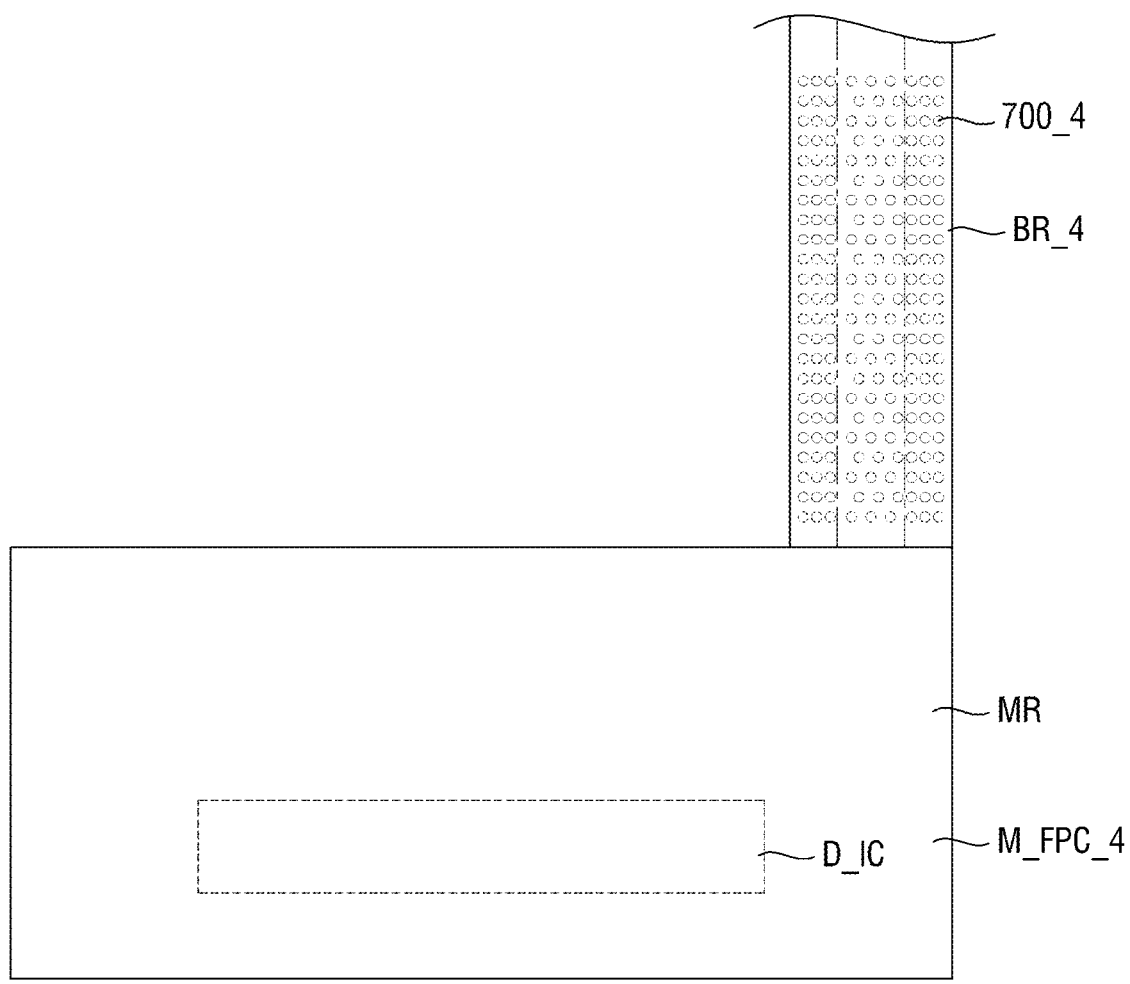
FIG. 11 is a plan view showing the layout of a main circuit board according to yet another exemplary embodiment of the present invention.

FIG. 10 is a cross-sectional view of a display device according to yet another exemplary embodiment of the present invention.

A first adhesive member 700_3 according to the exemplary embodiment shown FIG. 10 differs from the first adhesive member 700_2 according to the exemplary embodiment shown in FIGS. 8 and 9 in that the first adhesive member 700_3 is formed via a depressing process.

By employing the first adhesive pattern 703R1_3 and the second adhesive pattern 703R2_3 according to this exemplary embodiment of the present invention, it is possible to improve the adhesion between the upper surface of the main circuit board P_FPC_3 and the first region R1 and the second region R2.

Also in this exemplary embodiment, there may be level differences from the first region R1 to the third region R3. When the adhesive layer is formed as a single piece and disposed on the entire upper surface of the main circuit board M_FPC_3, the level differences may be seen from the outside through the display surface. In this regard, in the second region R2 where the level differences are created, by disposing the third adhesive pattern 703R3_3 of the main circuit board M_FPC_3 on the lower surface of the second region R2 and by attaching the main circuit board M_FPC_3 to the lower surface of the first region R1 and the second region R2 through the first and second adhesive patterns 703R1_3 and 703R2_3, it is possible to significantly suppress the level differences from being seen from the outside through the display surface.

In addition, if an adhesive layer is formed on the entire upper surface of the main circuit board M_FPC_3 and the main circuit board M_FPC_3 is attached to various features thereon through the adhesive layer, the adhesive layer may stick together and/or may wrinkle, such that the adhesion between the main circuit board M_FPC_3 and these features may become weak. In contrast, by employing the first adhesive member 700_3 including the third adhesive pattern 703R3_3 according to the exemplary embodiment of the present invention, it is possible to suppress the adhesive layer from sticking together and/or wrinkling, compared to the adhesive layer formed entirely. As a result, it is possible to prevent the adhesion between the maintain circuit board M_FPC_3 and the various features thereon from becoming weak.

Figure 12:
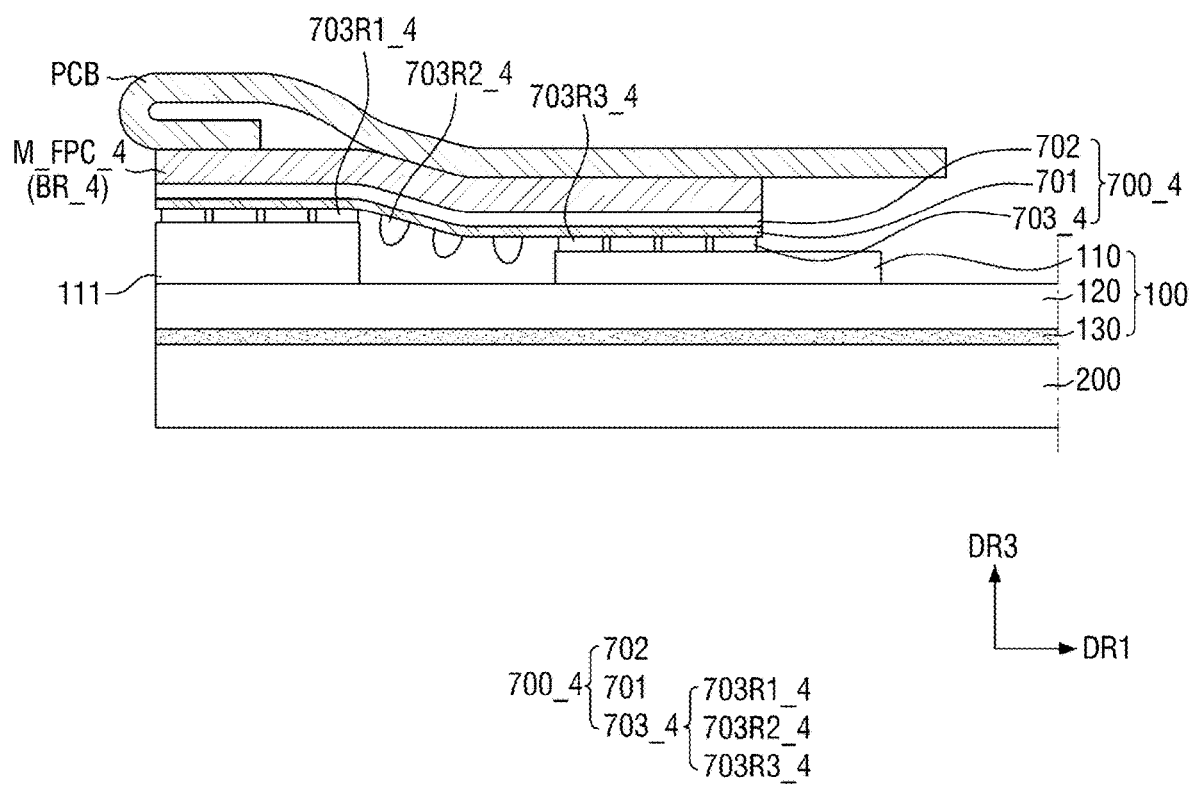
FIG. 12 is a cross-sectional view of a display device according to yet another exemplary embodiment of the present invention.

FIG. 12 is a cross-sectional view of a display device according to yet another exemplary embodiment of the present invention.

A first adhesive member 700_4 according to the exemplary embodiment shown in FIG. 12 is different from the first adhesive member 700 according to the exemplary embodiment shown in FIGS. 1 to 5 in that the density of the third adhesive pattern 703R3_4 is smaller than that of the first adhesive pattern 703R1_4 and that of the second adhesive pattern 703R2_4.

Specifically, on the upper surface of the main circuit board M_FPC, the number of the adhesive elements of the first pattern 703R1_4 per area in the first region R1 and the number of the adhesive elements of the second pattern 703R2_4 per area in the second region R2 may be greater than the number of the adhesive elements of the third pattern 703R3_4 per area in the third region R3.

Figure 13:
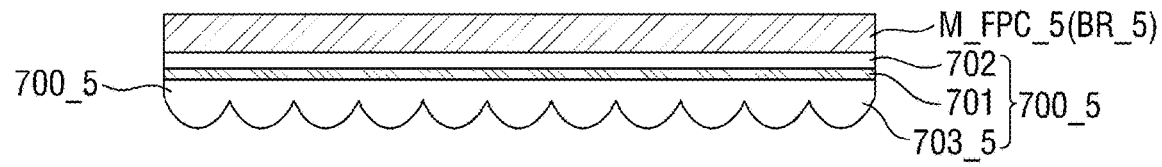
FIG. 13 is a cross-sectional view of a main circuit board and a first adhesive layer according to yet another exemplary embodiment of the present invention.

More specifically, the density of the third adhesive pattern 703R3_4 of the main circuit board M_FPC according to the exemplary embodiment shown in FIG. 13 may be smaller than that of the first adhesive pattern 703R1_4 and that of the second adhesion pattern 703R2_4. By employing the first adhesive member 700_4, it is possible to reduce the density of the third adhesive pattern 703R3_4 that is not substantially attached to the features thereon, thereby saving the cost of the process of attaching the main circuit board P_FPC_4 to various features thereon.

Also in this exemplary embodiment, there may be level differences from the first region R1 to the third region R3. If the adhesive layer is formed as a single piece and disposed on the entire upper surface of the main circuit board P_FPC_4, the level differences may be seen from the outside through the display surface. In this regard, on the lower surface in the first region R1 to the third region R3 where the level differences are created, by disposing the plurality of adhesive patterns 703R1_4, 703R2_4 and 703R3_4 of the main circuit board M_FPC_4 and by attaching the main circuit board M_FPC_4 to the lower surface of the first region R1 to the third region R3 through the adhesive patterns 703R1_4, 703R2_4 and 703R3_4, it is possible to significantly suppress the level differences from being seen from the outside through the display surface.

In addition, if an adhesive layer is formed on the upper surface of the main circuit board M_FPC_4 and the main circuit board M_FPC_4 is attached to various features thereon through the adhesive layer, the adhesive layer formed on the entire surface may stick together and/or may wrinkle, such that the adhesion between the main circuit board M_FPC_4 and these features may become weak. In contrast, by employing the first adhesive member 700_4 including the third adhesive pattern 703R3_4 according to the exemplary embodiment of the present invention, it is possible to suppress the adhesive layer from sticking together and/or wrinkling, compared to the adhesive layer formed entirely. As a result, it is possible to prevent the adhesion between the maintain circuit board M_FPC_4 and the various features thereon from becoming weak.

Figure 14:
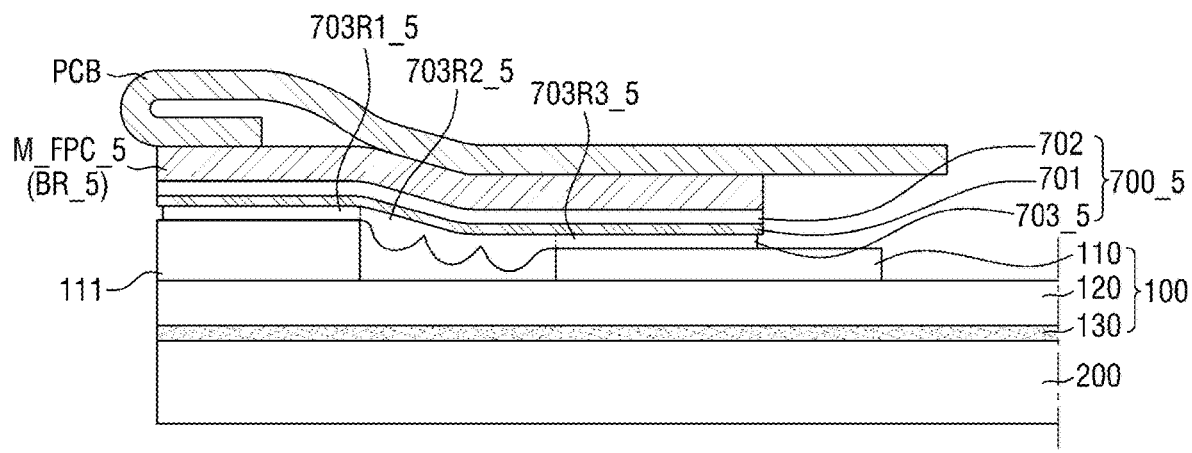
FIG. 14 is a cross-sectional view of a display device according to yet another exemplary embodiment of the present invention.
Figure 14:
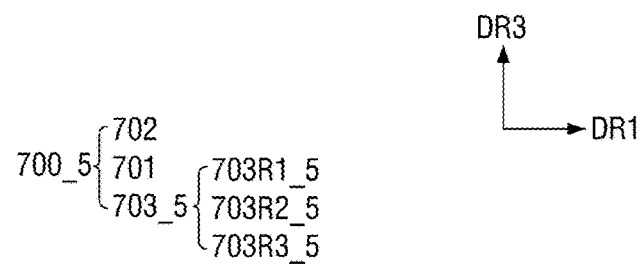

FIG. 13 is a cross-sectional view of a main circuit board and a first adhesive layer according to yet another exemplary embodiment of the present invention. FIG. 14 is a cross-sectional view of a display device according to yet another exemplary embodiment of the present invention.

A first adhesive member 700_5 according to the exemplary embodiment shown in FIG. 13 differs from the exemplary embodiment of FIGS. 1 to 5 in that an adhesive material is disposed entirely on a main circuit board M_FPC_5 and includes a pattern of wavy embossed shapes.

A first adhesive member 700_5 according to this exemplary embodiment may be disposed entirely on a main circuit board M_FPC_5. Further, the first adhesive member 700_5 may have a generally wavy embossed shape. The embossed shape may be formed via a transfer process before the main circuit board M_FPC is attached to the features under the display panel. Specifically, a release film (not shown) having an embossed shape is made adjacent to the first adhesive member 700_5. Subsequently, the release film is peeled off, and then an embossed shape complementary to the embossed shape of the release film can be formed at the interface between the release film and the first adhesive member 700_5.

Figure 15:
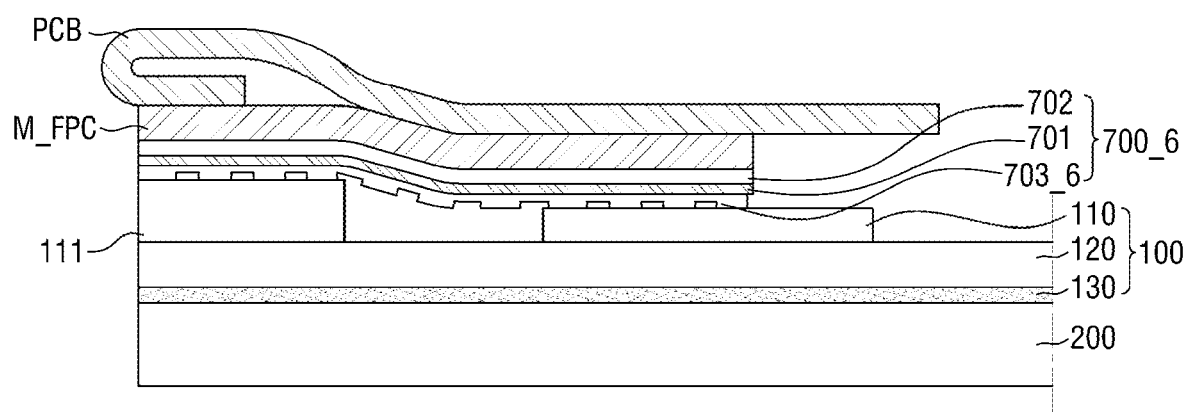
FIG. 15, FIG. 16, FIG. 17, FIG. 18, FIG. 19, FIG. 20, FIG. 21, FIG. 22, FIG. 23, FIG. 24, FIG. 25, and FIG. 26 are cross-sectional views of a display device according to another exemplary embodiment of the present invention.
Figure 15:
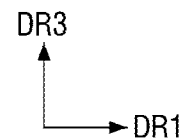

FIG. 15 is a cross-sectional view of a display device according to yet another exemplary embodiment of the present invention.

A first adhesive member 700_6 according to the exemplary embodiment shown in FIG. 15 differs from the first adhesive member 700 according to the exemplary embodiment of FIGS. 1 to 5 in that a second adhesive layer 703_6 does not expose a tape base 701 and includes a concave-convex profile. In addition, the second adhesive layer 703_6 may be formed via a depressing process.

Figure 16:
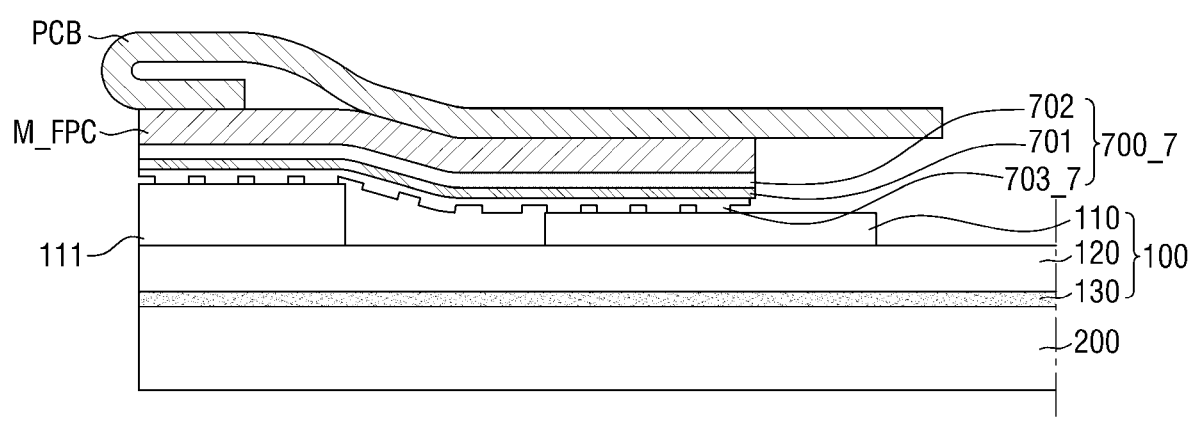
Figure 16:
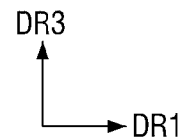

FIG. 16 is a cross-sectional view of a display device according to yet another exemplary embodiment of the present invention.

A first adhesive member 700_7 according to the exemplary embodiment shown in FIG. 16 differs from the first adhesive member 700 according to the exemplary embodiment of FIGS. 1 to 5 in that a second adhesive layer 703_7 does not expose a tape base 701 and includes a concave-convex profile. In addition, the second adhesive layer 703_7 may be formed via a raising process, unlike the exemplary embodiment shown in FIG. 15.

According to this exemplary embodiment, the concave-convex profile of the second adhesive layer 703_7 may be that of the first adhesive member 700_7.

Figure 17:
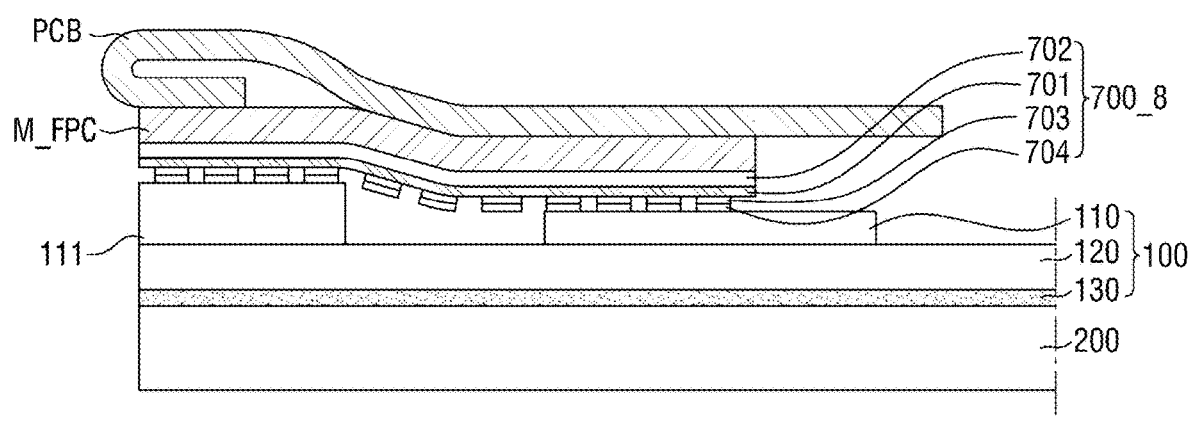
Figure 17:
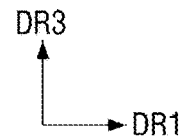

FIG. 17 is a cross-sectional view of a display device according to yet another exemplary embodiment of the present invention.

A first adhesive element 700_8 according to the exemplary embodiment shown in FIG. 17 differs from the first adhesive element 700 according to the exemplary embodiment of FIGS. 1 to 5 in that a third adhesive layer 704 is further disposed on a second adhesive layer 703. The third adhesive layer 704 may include a pattern of adhesive elements overlapping with the pattern of the second adhesive layer 703 in the thickness direction. That is to say, the pattern of the third adhesive layer 704 may correspond to the convex portions of the pattern of the second adhesive layer 703_7, and may be arranged such that they overlap with one another in the thickness direction. The area where the third adhesive layer 704 overlaps with the convex portions of the second adhesive layer 703 in the thickness direction may be convex portions of the adhesive member.

The width and thickness of each of the adhesive elements of the pattern of the third adhesive layer 704 may be, but is not limited to, equal to the width and thickness of each of the adhesive elements of the pattern of the second adhesive layer 703.

Figure 18:
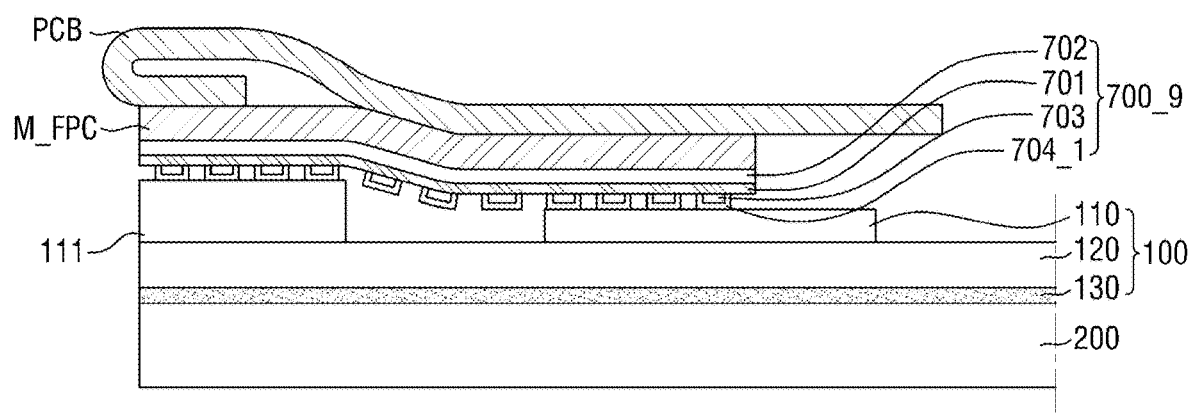
Figure 18:
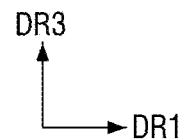

FIG. 18 is a cross-sectional view of a display device according to yet another exemplary embodiment of the present invention.

A first adhesive member 700_9 according to the exemplary embodiment shown in FIG. 18 differs from the first adhesive member 700_8 according to the exemplary embodiment of FIG. 17 in that a third adhesive layer 704_1 covers the upper surface and side surface of the second adhesive layer 703.

Figure 19:
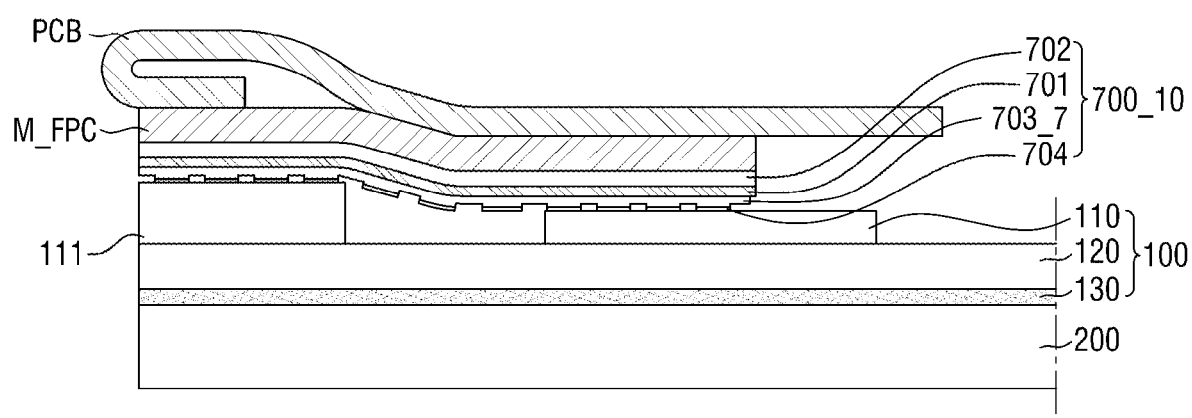
Figure 19:

FIG. 19 is a cross-sectional view of a display device according to yet another exemplary embodiment of the present invention.

A first adhesive member 700_10 according to the exemplary embodiment shown in FIG. 19 differs from the first adhesive member 700 according to the exemplary embodiment of FIGS. 1 to 5 in that the second adhesive layer 703_7 shown in FIG. 15 is applied to the first adhesive member 700_8 according to the exemplary embodiment shown in FIG. 17. The adhesive elements of the pattern of the third adhesive layer 704 may correspond to the convex portions of the second adhesive layer 703_7, respectively, and may be arranged such that they overlap with one another in the thickness direction. Accordingly, the concave-convex profile of the first adhesive member 700_10 may be an area where the convex portions of the second adhesive layer 703_7 and the adhesive elements of the pattern of the third adhesive layer 704 overlap with one another.

Figure 20:
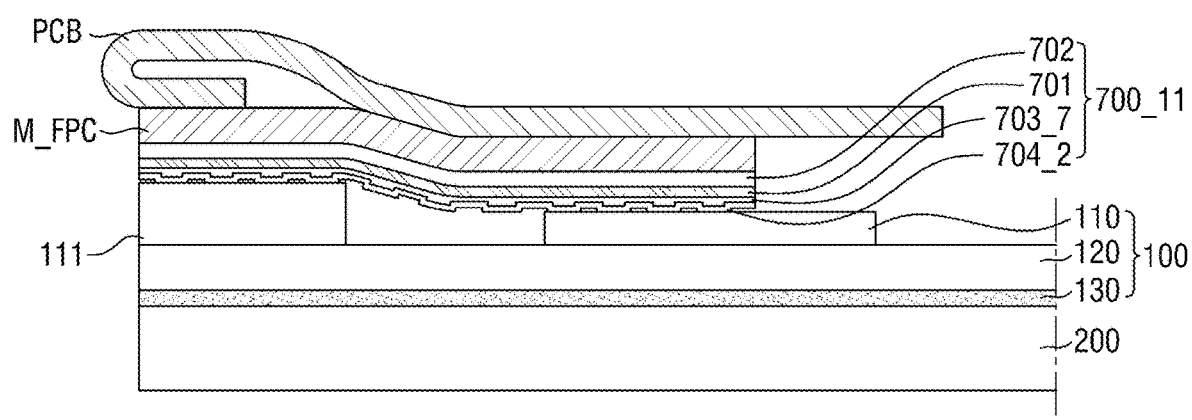

FIG. 20 is a cross-sectional view of a display device according to yet another exemplary embodiment of the present invention.

A first adhesive member 700_11 according to the exemplary embodiment shown in FIG. 20 differs from the first adhesive member 700 according to the exemplary embodiment of FIGS. 1 to 5 in that a third adhesive layer 704_2 covers the upper surface and side surface of the first adhesive layer 703_7 shown in FIG. 15 and covers the exposed part of the tape base 701 and formed integrally. The third adhesive layer 704_2 may be disposed on the upper surface of the second adhesive layer 703_7 having the concave-convex lower surface so as to reflect the concave-convex profile of the second adhesive layer 703_7 conformally and may include the shape of the concave-convex shape on the surface thereof. For example, the convex portions of the third adhesive layer 704_2 may overlap with the adhesive elements of the pattern of the second adhesive layer 703_7 in the thickness direction, and the concave portions of the third adhesive layer 704_2 may overlap with the locations where the second adhesive layer 703_7 is not disposed.

Figure 21:
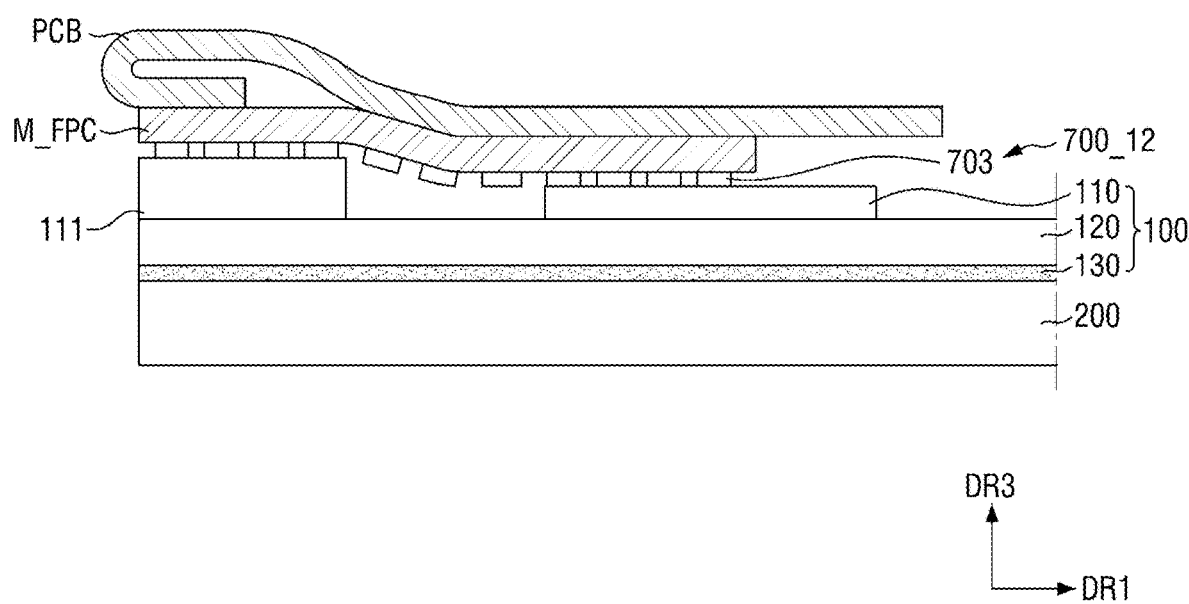

FIG. 21 is a cross-sectional view of a display device according to yet another exemplary embodiment of the present invention.

A first adhesive member 700_12 according to the exemplary embodiment shown in FIG. 21 differs from the first adhesive member 700 according to the exemplary embodiment of FIGS. 1 to 5 in that a second adhesive layer 703 only is disposed on the upper surface of a main circuit board M_FPC_5 and no tape base 701 is disposed thereon. Although the second adhesive layer 703 is shown as a single coupling layer in the drawings, the present disclosure is not limited thereto. The second adhesive layer 703 may be made up of multiple coupling layers.

Figure 22:
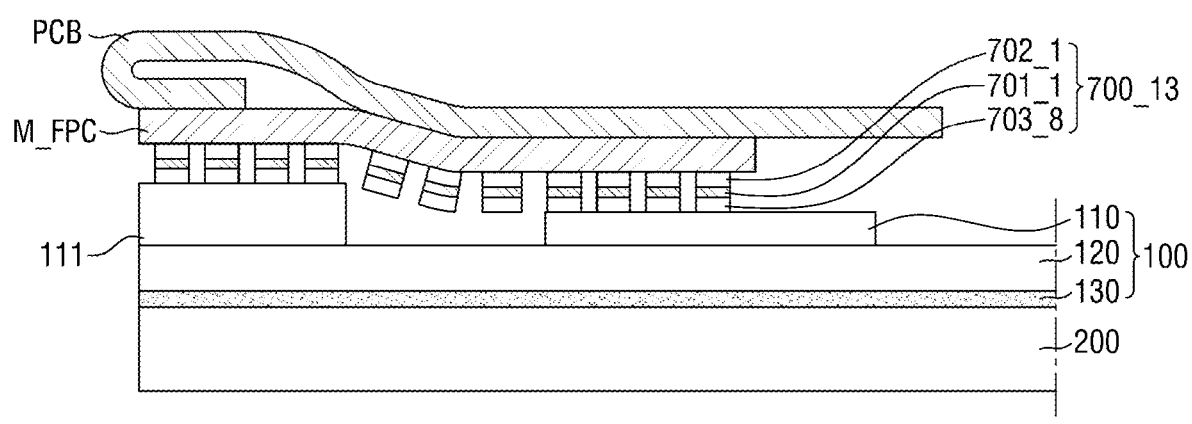

FIG. 22 is a cross-sectional view of a display device according to yet another exemplary embodiment of the present invention.

A first adhesive member 700_13 according to the exemplary embodiment shown in FIG. 22 is formed in patterns as a whole. Specifically, each of a tape base 701_1, a first adhesive layer 702_1 and a second adhesive layer 703_8 may be patterned. That is to say, the structure formed by stacking the tape base 701_1, the first adhesive layer 702_1 and the second adhesive layer 703_8 sequentially may be an adhesive pattern. More than one adhesive pattern may be disposed. The tape base 701_1, the first adhesive layer 702_1 and the second adhesive layer 703_8 of each pattern may overlap with one another in the thickness direction, with their side surfaces aligned with one another. In this exemplary embodiment, the side surfaces may be aligned with one another as cutting surfaces.

Figure 23:
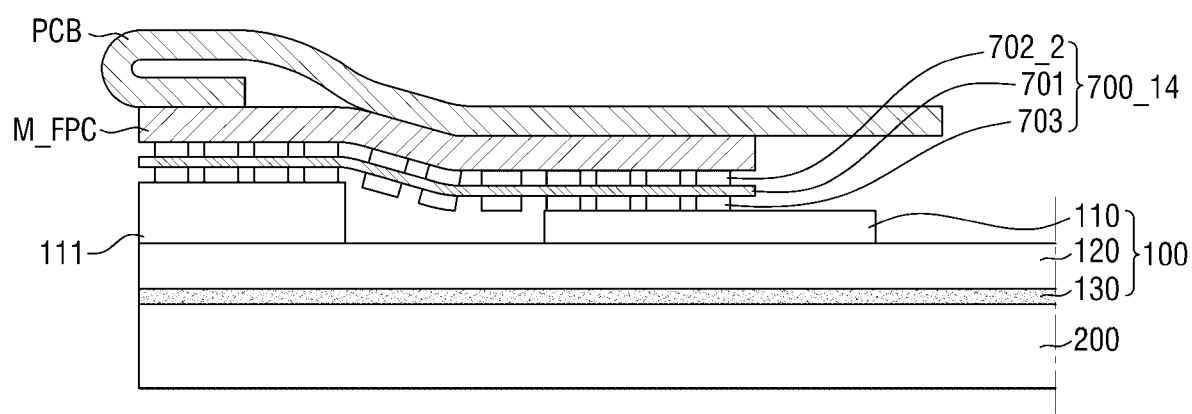

FIG. 23 is a cross-sectional view of a display device according to yet another exemplary embodiment of the present invention.

A first adhesive layer 700_14 according to the exemplary embodiment shown in FIG. 23 differs from the first adhesive member 700 according to the exemplary embodiment shown in FIGS. 1 to 5 in that a first adhesive layer 702_2 has a pattern of adhesive elements and the adhesive elements are arranged such that they correspond to the convex portions of the second adhesive layer 703, and accordingly they overlap with the convex portions of the second adhesive layer 703 in the thickness direction with their side surfaces aligned with one another. Although the second adhesive layer 703 is employed in the example shown in FIG. 23, this is merely illustrative. Any of the second adhesive layers according to the above-described exemplary embodiments of the present disclosure may be employed.

Figure 24:
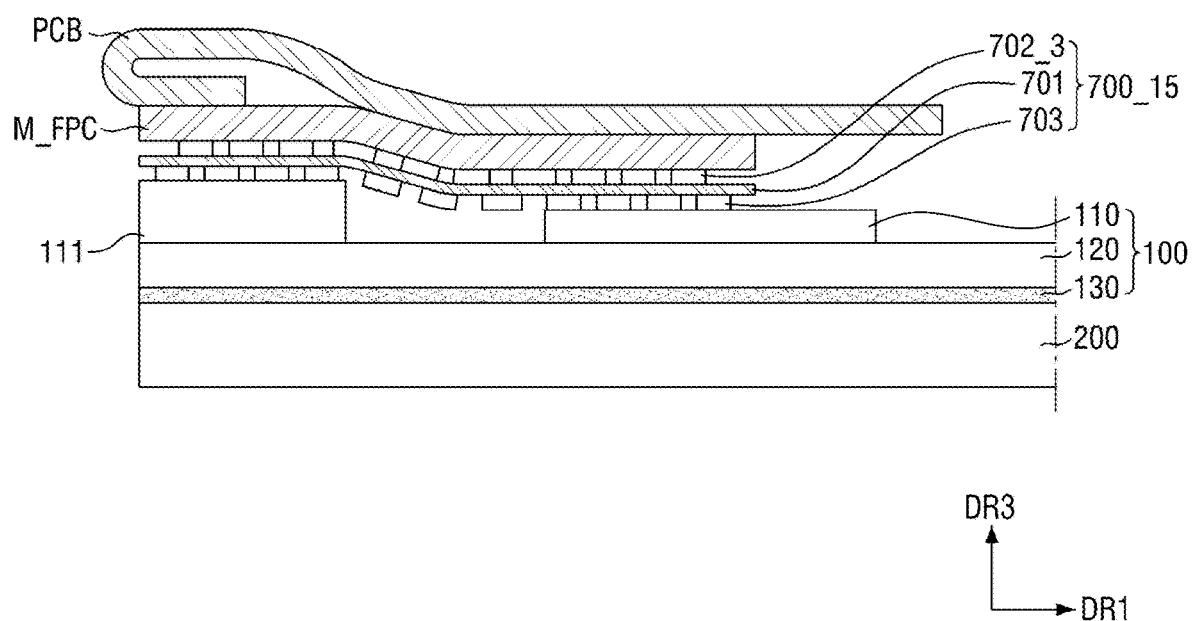

FIG. 24 is a cross-sectional view of a display device according to yet another exemplary embodiment of the present invention.

A first adhesive layer 700_15 according to the exemplary embodiment shown in FIG. 24 is similar to the exemplary embodiment shown in FIG. 23 in that a first adhesive layer 702_3 has a pattern of adhesive elements but differs from the first adhesive member 700 according to the exemplary embodiment shown in FIGS. 1 to 5 in that the adhesive elements of the pattern of the first adhesive layer 702_3 correspond to the locations where the second adhesive layer 703 is not disposed and overlap in the thickness direction. More specifically, each of the first adhesive layer 702_3 and the second adhesive layer 703 may have a pattern of adhesive elements. The patterns may not be aligned with one another in the thickness direction but may be arranged in a zigzag vertically in the third direction DR3.

Figure 25:
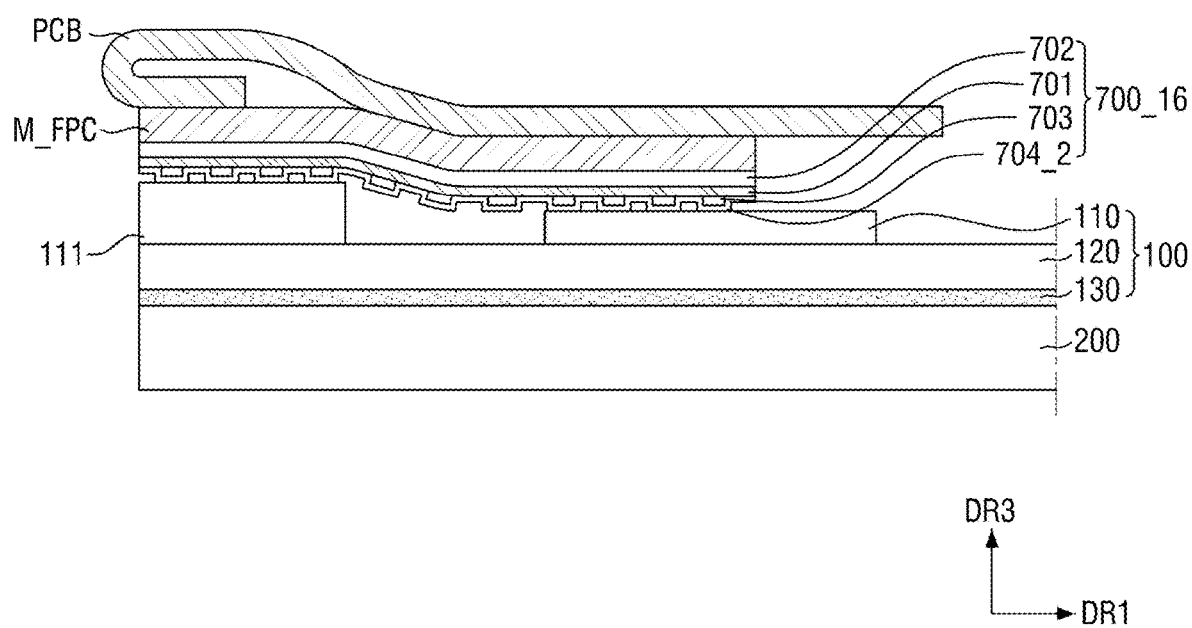

FIG. 25 is a cross-sectional view of a display device according to yet another exemplary embodiment of the present invention.

The exemplary embodiment shown in FIG. 25 differs from the exemplary embodiment shown in FIGS. 1 to 6 in that it further includes a third adhesive layer 704_2. More specifically, the third adhesive layer 704_2 may completely cover the second adhesive layer 703. Further, the third adhesive layer 704_2 may cover parts of the tape base 701 exposed through the pattern of the second adhesive layer 703. The third adhesive layer 704_2 may cover side surfaces and a surface of each of the adhesive elements of the pattern of the second adhesive layer 703.

Figure 26:
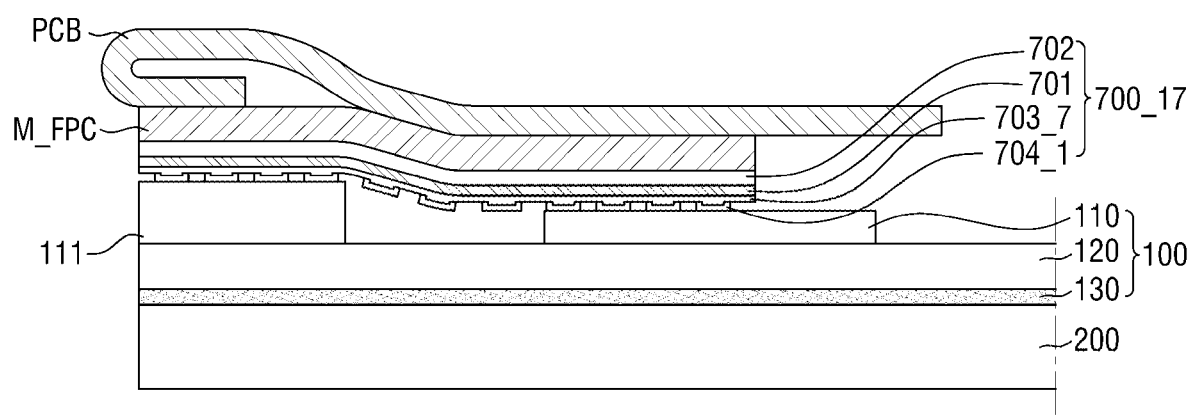

FIG. 26 is a cross-sectional view of a display device according to yet another exemplary embodiment of the present invention.

The exemplary embodiment shown in FIG. 26 differs from the exemplary embodiment according to FIGS. 1 to 6 in that it further includes a third adhesive layer 704_1 on a second adhesive layer 703_7 according to the exemplary embodiment shown in FIGS. 15 and 16.

Figure 27:
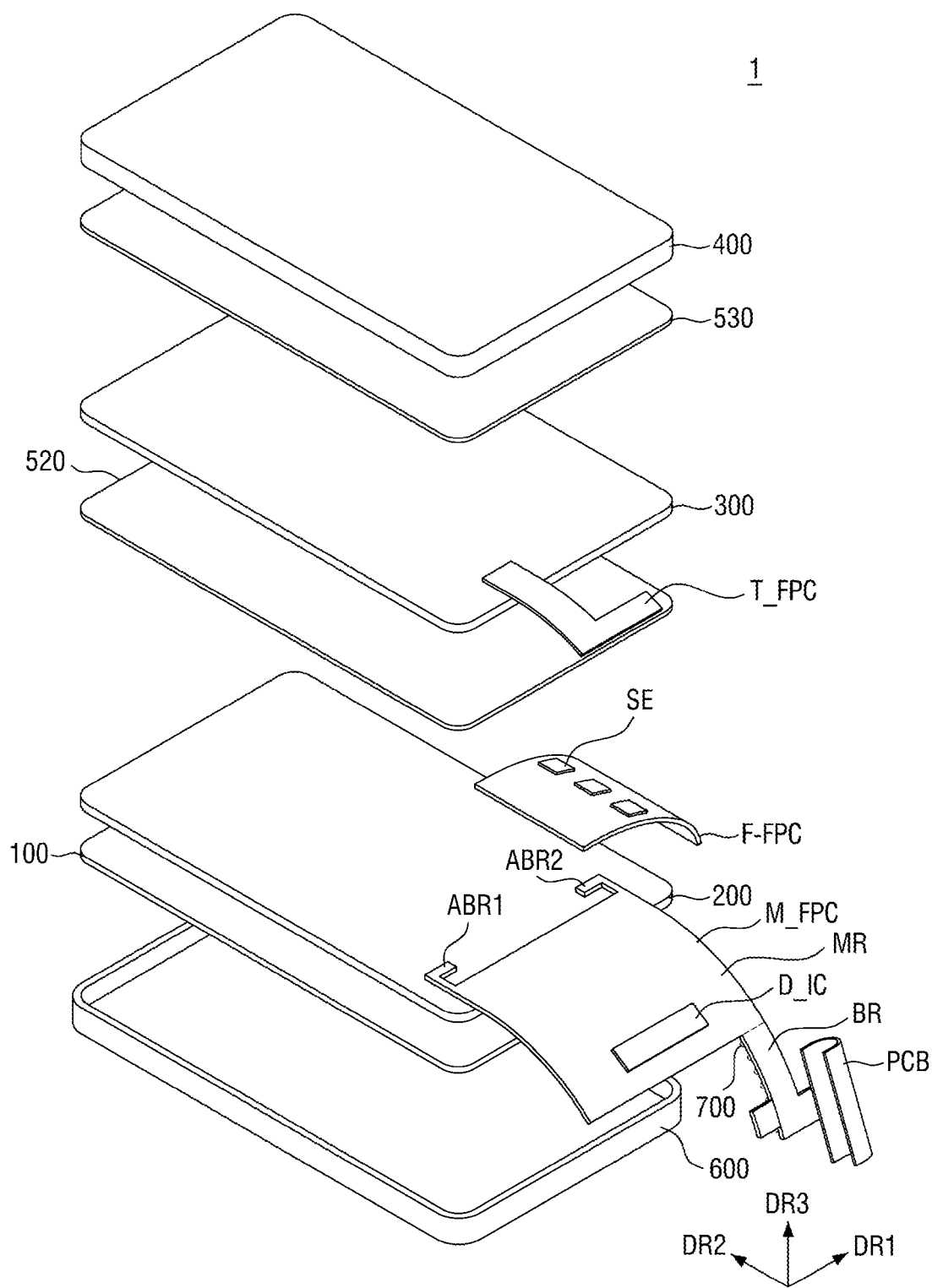
FIG. 27 is an exploded, perspective view of a display device according to yet another exemplary embodiment of the present invention.
Figure 28:
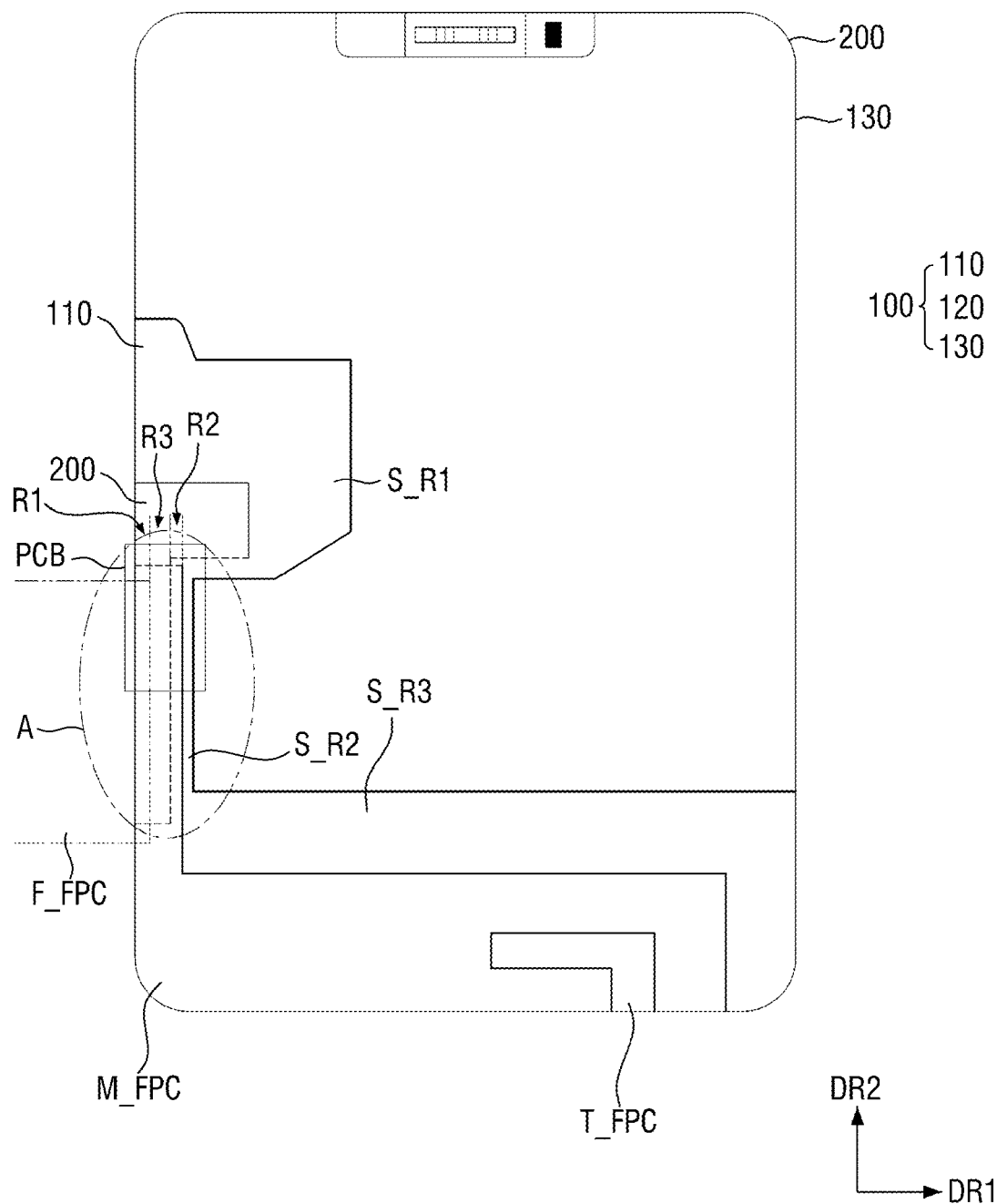
FIG. 28 is a plan view showing the layout of a display device according to yet another exemplary embodiment of the present invention.
Figure 29:
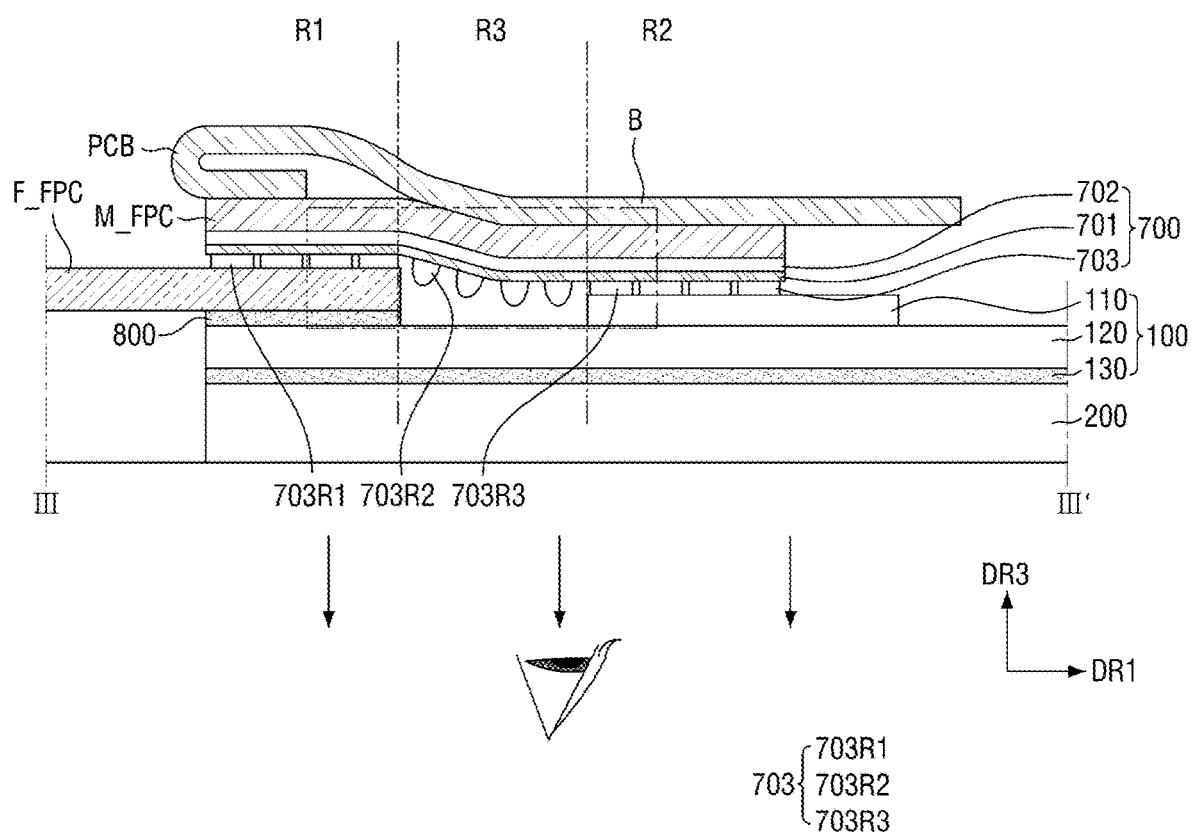
FIG. 29 is a cross-sectional view of a display device according to yet another exemplary embodiment of the present invention.

FIG. 27 is an exploded, perspective view of a display device according to yet another exemplary embodiment of the present invention. FIG. 28 is a plan view showing a layout of a display device according to another exemplary embodiment of the present invention. FIG. 29 is a cross-sectional view of a display device according to yet another exemplary embodiment of the present invention.

Referring to FIGS. 27 to 29, a circuit board may be attached to one side of the display panel 200. The circuit board may be a flexible circuit board. In an exemplary embodiment, the circuit board may be a force sensor circuit board F_FPC. In an exemplary embodiment, the area where the force sensor circuit board F_FPC is attached to the display panel 200 may be adjacent to the bending region BR of the main circuit board M_FPC in the first direction DR1.

The force sensor circuit board F_FPC may be a flexible printed circuit board containing a flexible material. The force sensor circuit board F_FPC may include a plurality of sensor electrodes SE. The sensor electrodes SE may include a conductive material. The conductive material may include a metal or an alloy thereof. Examples of the metal may include gold (Au), silver (Ag), aluminum (Al), molybdenum (Mo), chrome (Cr), titanium (Ti), nickel (Ni), neodymium (Nd), copper (Cu), platinum (Pt), etc. Although not shown in the drawings, a shielding electrode (not shown) may be disposed between the force sensor circuit board F_FPC and the sensor electrodes SE. The shielding electrode may prevent electrical interference between the plurality of conductive patterns disposed on the display panel 200 and the sensor electrodes SE. The shield electrode may be made of a transparent conductive material such as indium tin oxide (ITO), indium zinc oxide (IZO), indium tin zinc oxide (ITZO), Al-doped zinc oxide (AZO) and may be made of the same material as the sensor electrode SE. An insulating layer (not shown) may be disposed between the shielding electrode and the sensor electrodes SE. The sensor electrodes SE can be protected from moisture, oxygen, etc. by the insulating layer. The insulating layer may include an organic or inorganic insulating material.

An adhesive layer 800 may be further disposed on the lower surface of the force sensor circuit board F_FPC. When it is bent along the bending direction, for example, the third direction DR3, the force sensor circuit board F_FPC may be attached under the display panel 200 through the second adhesive layer 800. In this case, the force sensor circuit board F_FPC may partially overlap with the main circuit board M_FPC in the thickness direction.

According to this exemplary embodiment, there may be level differences from the first region R1 to the third region R3. If the adhesive layer is formed as a single piece and disposed on the entire upper surface of the main circuit board P_FPC_1, the level differences may be seen from the outside through the display surface. In this regard, on the lower surface in the first region R1 to the third region R3 where the level differences are created, by disposing the plurality of adhesive patterns 703R1_1, 703R2_1 and 703R3_1 of the main circuit board P_FPC_1 and by attaching the main circuit board P_FPC_1 through the adhesive patterns 703R1_1, 703R2_1 it is possible to significantly suppress the level differences from being seen from the outside through the display surface.

In addition, if an adhesive layer is formed on the upper surface of the main circuit board P_FPC_1 and the main circuit board P_FPC_1 is attached to various features thereon through the adhesive layer, the adhesive layer formed on the entire surface may stick together and/or may wrinkle, such that the adhesion between the main circuit board P_FPC_1 and these features may become weak. In contrast, by employing the first adhesive element 700_1 including the adhesive patterns 703R1_1, 703R2_1 and 703R3_1 according to the exemplary embodiment of the present invention, it is possible to suppress the adhesive layer from sticking together and/or wrinkling. As a result, it is possible to prevent the adhesion between the main circuit board P_FPC_1 and the various features thereon from becoming weak.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel;
a panel support disposed on a lower surface of the display panel;
a first circuit board connected to the display panel and disposed such that it overlaps with a lower surface of the panel support; and
an adhesive member disposed between the panel support and the first circuit board and comprising a concave-convex profile on a first surface facing the panel support,
wherein the first circuit board and the panel support are at least partially coupled with each other by the adhesive member.

2. The display device of claim 1, wherein:
a second surface of the adhesive member is attached to the first circuit board; and
the adhesive member comprises:
a first region where the concave-convex profile on the first surface comes in contact with the panel support; and
a second region where the concave-convex profile is spaced apart from the panel support.

3. The display device of claim 2, wherein a thickness of the adhesive member in the second region is greater than a thickness of the adhesive member in the first region.

4. The display device of claim 2, wherein a width of the adhesive member in the second region is less than a width of the adhesive member in the first region.

5. The display device of claim 2, wherein:
the panel support comprises a first sheet and a second sheet disposed on a lower surface of the first sheet in the first region;
the first sheet is disposed on the entire lower surface of the display panel; and
the second sheet is attached to the first circuit board.

6. The display device of claim 5, wherein the panel support is spaced apart from the first circuit board in the second region.

7. The display device of claim 6, wherein:
the panel support further comprises a third region adjacent to the second region;
the panel support comprises a third sheet disposed on the lower surface of the first sheet in the third region; and
the third sheet is attached to the first circuit board.

8. The display device of claim 7, wherein a distance between the first circuit board and the third sheet in the third region is less than a distance between the first circuit board and the first sheet in the second region.

9. The display device of claim 8, wherein the first sheet is a shielding electrode layer.

10. The display device of claim 9, wherein the second sheet is a heat dissipation functional layer.

11. The display device of claim 1, wherein:
the adhesive member comprises a base, a first adhesive layer disposed between an upper surface of the base and the lower surface of the panel support and comprising a first pattern of adhesive elements, and a second adhesive layer disposed between a lower surface of the base and the first circuit board;
the adhesive elements of the first pattern form convex portions of the adhesive member, and locations where the first pattern is not disposed form concave portions of the adhesive member; and
the upper surface of the base is exposed at the concave portions of the adhesive member.

12. The display device of claim 11, wherein:
the second adhesive layer comprises a second pattern of adhesive elements; and
the second pattern do not overlap with the first pattern of the first adhesive layer in a thickness direction.

13. The display device of claim 1, wherein:
the adhesive member comprises a base, a first adhesive layer disposed on an upper surface of the base and comprising a pattern of adhesive elements, and a second adhesive layer disposed between a lower surface of the base and the first circuit board;
a part of the upper surface of the base is exposed at the locations where the pattern is not disposed;
the adhesive member further comprises a third adhesive layer covering an upper surface and side surface of the first adhesive layer and the exposed upper surface of the base, disposed between the first adhesive layer and the panel support, and comprising the concave-convex profile of the adhesive member;
the convex portions of the third adhesive layer overlap with the pattern of the first adhesive layer in the thickness direction; and
the concave portions of the third adhesive layer overlap with the locations where the pattern is not disposed.

14. The display device of claim 1, wherein:
the adhesive member comprises a base, a first adhesive layer disposed on an upper surface of the base and comprising a first pattern of adhesive elements, a second adhesive layer disposed between a lower surface of the base and the first circuit board, and a third adhesive layer comprising a second pattern of adhesive elements;
the second pattern of the third adhesive layer disposed on an upper surface of the first adhesive pattern to overlap it;
the third adhesive layer is disposed between the first adhesive layer and the panel support; and
the convex portions of the adhesive member overlap with locations where the first pattern and the second pattern overlap with one another in the thickness direction.

15. The display device of claim 1, wherein:
the adhesive member comprises a base, a first adhesive layer disposed between the upper surface of the base and the panel support, and a second adhesive layer disposed between a lower surface of the base and the first circuit board; and
the first adhesive layer comprises the concave-convex profile of the adhesive member.

16. The display device of claim 15, wherein:
the second adhesive layer comprises a pattern of adhesive elements; and
the pattern does not overlap with the convex portions of the first adhesive layer in the thickness direction.

17. The display device of claim 15, wherein:
the adhesive member further comprises a third adhesive layer covering the first adhesive layer, disposed between the first adhesive layer and the panel support, and comprising the concave-convex profile of the adhesive member;
the first adhesive layer comprises a second concave-convex profile, and the convex portions of the third adhesive layer overlap with the second concave portions of the first adhesive layer in the thickness direction; and
the concave portions of the third adhesive layer overlaps with the second concave portions of the first adhesive layer in the thickness direction.

18. The display device of claim 15, wherein:
the adhesive member further comprises a third adhesive layer disposed on an upper surface of the first adhesive layer and disposed between the first adhesive layer and the panel support;
the first adhesive layer comprises a second concave-convex profile;
wherein the third adhesive layer comprises a pattern of adhesive elements; and
the convex portions of the adhesive member overlap with locations where the pattern of the third adhesive layer overlaps with the second convex portions of the first adhesive layer in thickness direction.

19. The display device of claim 1, wherein:
the adhesive member comprises a pattern of adhesive elements; and
the pattern comprises:
  a base;
  a first adhesive layer disposed between an upper surface of the base and a lower surface of the panel support; and
  a second adhesive layer disposed between a lower surface of the base and the first circuit board.

20. The display device of claim 1, wherein:
each of the convex portions of the adhesive member has an island shape and the convex portions are arranged in a first direction and a second direction perpendicular to the first direction; and
each of the convex portions has at least one of a circular shape, an elliptical shape, a rectangular shape, and a diamond shape when viewed from a top.

* * * * *